(12) United States Patent
Ogasahara et al.

(10) Patent No.: US 9,640,238 B2
(45) Date of Patent: May 2, 2017

(54) DATA GENERATING DEVICE AND DATA GENERATING METHOD

(71) Applicant: Panasonic Intellectual Property Management Co., Ltd., Osaka (JP)

(72) Inventors: Satoru Ogasahara, Aichi (JP); Yuhei Yoshimoto, Hyogo (JP); Yoshikazu Katoh, Osaka (JP)

(73) Assignee: PANASONIC INTELLECTUAL PROPERTY MANAGEMENT CO., LTD., Osaka (JP)

(*) Notice: Subject to any disclaimer, the term of this patent is extended or adjusted under 35 U.S.C. 154(b) by 4 days.

(21) Appl. No.: 14/711,785

(22) Filed: May 14, 2015

(65) Prior Publication Data

US 2015/0340092 A1 Nov. 26, 2015

(30) Foreign Application Priority Data

May 21, 2014 (JP) .................. 2014-105600

(51) Int. Cl.
*G11C 11/16* (2006.01)
*G11C 13/00* (2006.01)
*G11C 11/56* (2006.01)
*G11C 29/06* (2006.01)
*G11C 29/36* (2006.01)

(52) U.S. Cl.
CPC .......... *G11C 11/16* (2013.01); *G11C 11/5685* (2013.01); *G11C 13/004* (2013.01); *G11C 13/0035* (2013.01); *G11C 29/06* (2013.01); *G11C 29/36* (2013.01); *G11C 13/0007* (2013.01); *G11C 2013/0054* (2013.01); *G11C 2211/5644* (2013.01)

(58) Field of Classification Search
CPC .... G11C 11/16; G11C 11/5685; G11C 13/004
See application file for complete search history.

(56) References Cited

U.S. PATENT DOCUMENTS

2013/0308371 A1* 11/2013 Kanzawa .......... G11C 13/0007
365/148

FOREIGN PATENT DOCUMENTS

| JP | 2006-241251 | 9/2006 |
|----|-------------|--------|
| JP | 2011-013902 | 1/2011 |
| JP | 2014-021529 | 2/2014 |
| JP | 2014-021530 | 2/2014 |
| WO | 2012/105232 | 8/2012 |
| WO | 2014/119329 | 8/2014 |

* cited by examiner

*Primary Examiner* — Edward Dudek, Jr.
(74) *Attorney, Agent, or Firm* — McDermott Will & Emery LLP

(57) ABSTRACT

A data generating device includes: a memory cell array including a plurality of memory cells; a read circuit operative to obtain a plurality of resistance value information pieces from the plurality of memory cells; and a data generator circuit operative to set a condition on the basis of the plurality of resistance value information pieces, and generating data by allocating, on the basis of the condition, the plurality of resistance value information pieces into a plurality of sets which respectively correspond to a plurality of values constituting the data. Each of the plurality of memory cells has a characteristic where, when in a variable state, a resistance value thereof reversibly changes between a plurality of variable resistance value ranges in accordance with an electric stress applied.

15 Claims, 19 Drawing Sheets

FIG. 19

| | TEST EXAMPLE 1 | TEST EXAMPLE 2 | TEST EXAMPLE 3 |
|---|---|---|---|
| DATA SIZE (BITS) | 1 k | 256 k | 256 k |
| BLOCK DATA SIZE (BITS) | - | - | 4 k |
| DETERMINATION VALUE CONTROL | NONE | NONE | NONE |
| MONOBIT TEST | PASSED | PASSED | PASSED |
| EQUIFREQUENCY TEST BY BLOCK | PASSED | FAILED | PASSED |
| RUNS TEST | PASSED | PASSED | PASSED |
| LONGEST RUNS TEST BY BLOCK | PASSED | PASSED | PASSED |
| BINARY MATRIX RANK TEST | PASSED | PASSED | PASSED |
| DISCRETE FOURIER TRANSFORM TEST | PASSED | PASSED | PASSED |
| SERIAL TEST | PASSED | PASSED | PASSED |
| APPROXIMATE ENTROPY TEST | PASSED | PASSED | PASSED |
| CUMULATIVE SUM TEST | PASSED | FAILED | PASSED |

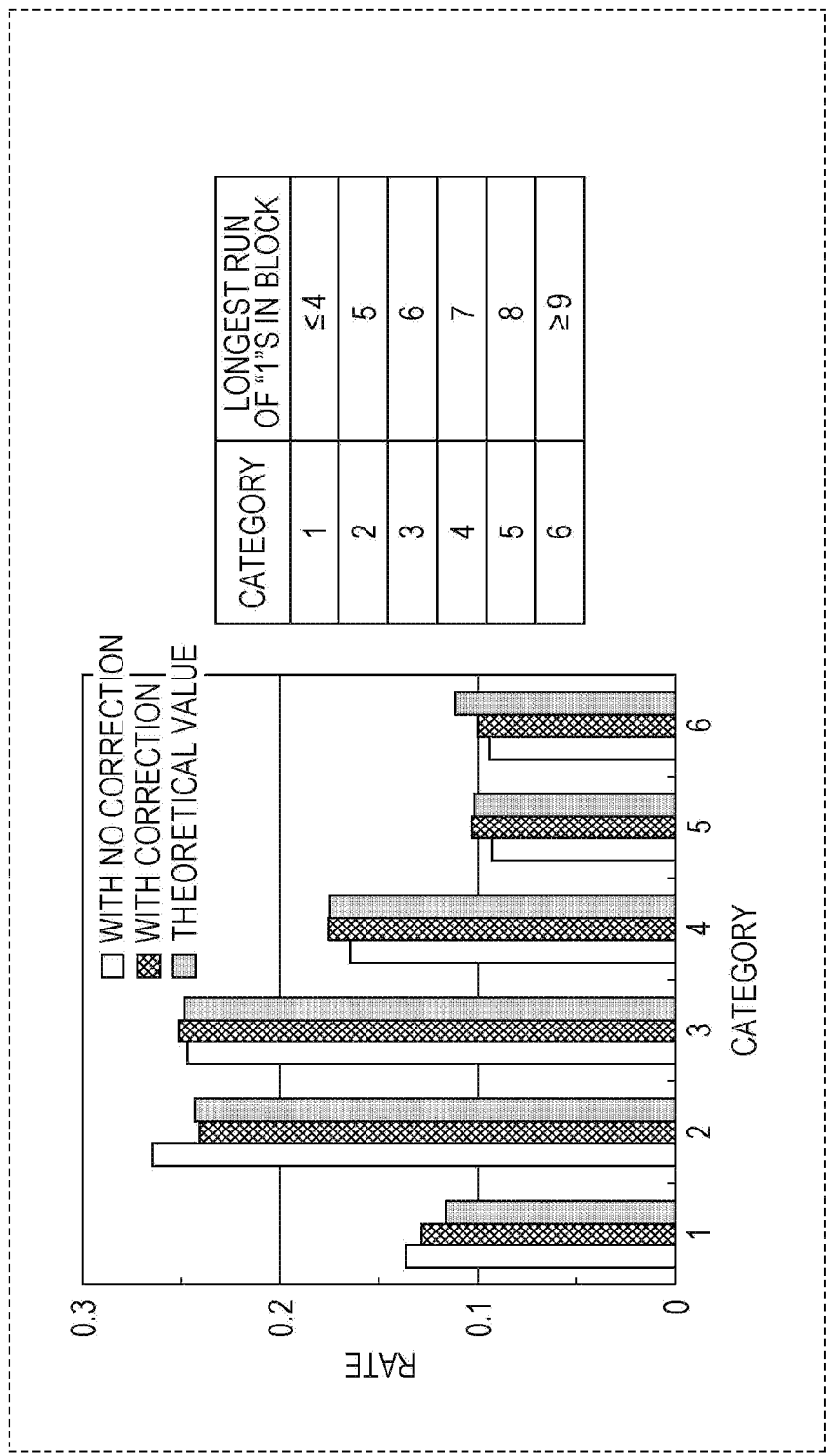

FIG. 23

| | TEST EXAMPLE 3 | TEST EXAMPLE 4 | TEST EXAMPLE 5 | TEST EXAMPLE 6 |
|---|---|---|---|---|
| DATA SIZE (BITS) | 256 k | 512 k | 512 k | 512 k |
| BLOCK DATA SIZE (BITS) | 4 k | 4 k | 4 k | 4 k |
| DETERMINATION VALUE CONTROL BY CUMULATIVE DIFFERENCE IN NUMBERS | NONE | NONE | YES | YES |
| DIFFERENCE-IN NUMBERS OFFSET VALUE (COUNT) | 0 | 0 | 0 | 8 |
| DIFFERENCE-IN NUMBERS OF "1" – "0" (COUNT) | 990 | 2362 | 120 | 1022 |
| MONOBIT TEST | PASSED | FAILED | PASSED | PASSED |
| EQUIFREQUENCY TEST BY BLOCK | PASSED | PASSED | PASSED | PASSED |
| RUNS TEST | PASSED | FAILED | FAILED | PASSED |
| LONGEST RUNS TEST BY BLOCK | PASSED | PASSED | FAILED | PASSED |
| BINARY MATRIX RANK TEST | PASSED | FAILED | PASSED | PASSED |
| DISCRETE FOURIER TRANSFORM TEST | PASSED | PASSED | PASSED | PASSED |
| SERIAL TEST | PASSED | PASSED | PASSED | PASSED |
| APPROXIMATE ENTROPY TEST | PASSED | FAILED | FAILED | PASSED |
| CUMULATIVE SUM TEST | PASSED | FAILED | PASSED | PASSED |

DATA GENERATING DEVICE AND DATA GENERATING METHOD

BACKGROUND

1. Technical Field

The present disclosure relates to a data generating device and a data generating method.

2. Description of the Related Art

Japanese Unexamined Patent Application Publication No. 2011-13902 discloses a technology in which a spin injection current, of which the magnetization reverses at a probability of ½, is supplied to magnetoresistive random access memory (MRAM), whereby random numbers are generated.

SUMMARY

One non-limiting and exemplary embodiment provides an unprecedented data generating method, which is applicable to safer encryption technology, for example.

A data generating device according to an aspect of the present disclosure includes: a memory cell array including a plurality of memory cells; a read circuit operative to obtain a plurality of resistance value information pieces from the plurality of memory cells; and a data generator circuit operative to set a condition on the basis of the plurality of resistance value information pieces, and generate data by allocating, on the basis of the condition, the plurality of resistance value information pieces into a plurality of sets which respectively correspond to a plurality of values constituting the data. Each of the plurality of memory cells has a characteristic where, when in a variable state, a resistance value thereof reversibly changes between a plurality of variable resistance value ranges in accordance with an electric stress applied.

It should be noted that comprehensive or specific embodiments may be implemented as a system, a method, an integrated circuit, a computer program, a storage medium, or any selective combination thereof.

According to an embodiment of the present disclosure, an unprecedented data generating method can be provided, which is applicable to safer encryption technology, and so forth, for example.

Additional benefits and advantages of the disclosed embodiments will become apparent from the specification and drawings. The benefits and/or advantages may be individually obtained by the various embodiments and features of the specification and drawings, which need not all be provided in order to obtain one or more of such benefits and/or advantages.

BRIEF DESCRIPTION OF THE DRAWINGS

FIG. 19 is a diagram illustrating test results of generated data;

FIG. 22 is a graph illustrating the rate of longest runs in blocks in generated data; and FIG. 23 is a diagram illustrating test results of generated data.

DETAILED DESCRIPTION

Underlying Knowledge Forming Basis of the Present Disclosure

Before describing the embodiment, the underlying knowledge which the present inventors have found will be described. It should be noted that the following description is to aid understanding of the present disclosure, and does not restrict the present disclosure in any way.

The present inventors performed experimentation using a memory cell array including so-called 1T1R type memory cells, each of which includes one transistor and one variable resistance element, the variable resistance element including an oxygen-deficient tantalum oxide ($TaO_x$) layer.

Figure 1:
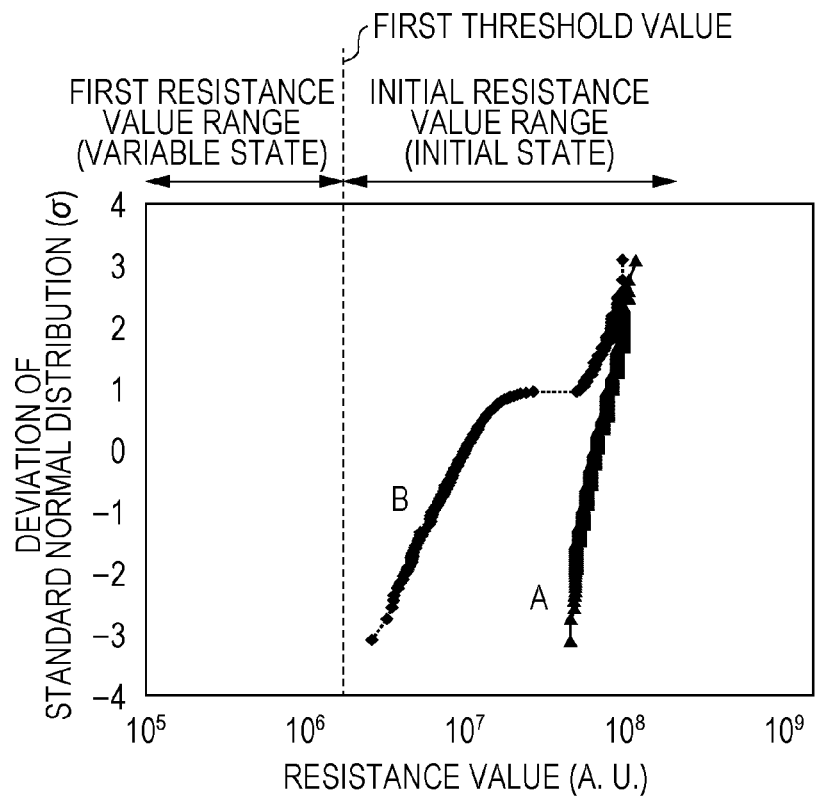
FIG. 1 is a graph illustrating distribution of resistance values in 1 kilobit memory cells.

FIG. 1 is a graph illustrating an example of distribution of resistance values in 1 kilobit memory cells. The horizontal axis represents the resistance value, and the vertical axis represents the deviation of standard normal distribution. The configuration of the variable resistance elements contained in the memory cells is as follows. The size of a variable resistance element was approximately 400 nm×400 nm. The material of the lower electrode was tantalum nitride (TaN), and the thickness of the lower electrode was approximately 50 nm. The material of the upper electrode was iridium, and the thickness of the upper electrode was approximately 100 nm. The variable resistance layer included a first tantalum oxide layer and a second tantalum oxide layer. The thickness of the first tantalum oxide layer was approximately 65 nm, and the thickness of the second tantalum oxide layer was approximately 5 nm.

The state A illustrated in FIG. 1 is not only an initial state, this is equivalent to a state where absolutely no electric stress has been applied after manufacturing. This state may be referred to as a "first initial state". A memory cell in the state A has had no electric stress applied thereto. The variance in resistance values is small and the resistance value is high for memory cells in the state A, as illustrated in FIG. 1. Accordingly, state A, i.e., the first initial state, is extremely stable.

The state B illustrated in FIG. 1 is equivalent to a state where a predetermined electric stress has been applied to the memory cells in the first initial state. The predetermined electric stress is larger than the electric stress applied when reading resistance value information, and smaller than the forming stress. This predetermined electric stress may be referred to as "data generation electric stress" in the present disclosure. A state where the resistance value stays within an initial resistance value range after application of the data generation electric stress may be referred to as a "second initial state".

The distribution of resistance values in the state B was spread more widely toward the low-resistance side as compared with the distribution of resistance values in the first initial state. Specifically, the resistance values in the second initial state are distributed to near a first threshold value serving as a standard for determination between an initial state and a variable state. The cause of difference in the resistance value distribution for state A and the resistance value distribution for state B is thought to be due to the following.

A memory cell in an initial state has multiple defect sites in the metal oxides, and the distribution thereof is random from one memory cell to another. When electric stress is applied to a memory cell in the first initial state, the density of the defect sites increases depending on the intensity and number of times of stress, and the defect sites gradually connect to each other. For defect sites to connect means for a site between one defect site and another defect site to become a defect site, thereby forming a string of defect sites. Formation of a filament within the variable resistance element completes forming processing, and the variable resistance element is thus in a variable state. In the present disclosure, strings of defect sites which make the memory cell to be in a variable state may be referred to as filaments. In other words, a memory cell in a variable state has a filament, while a memory cell in the initial state may have strings of defect sites but not a filament.

For example, in a case where a certain electric stress is applied to a memory cell in the first initial state, strings of defect sites may be partially generated in the memory cell even before the forming processing is completed. The length and width of these strings of defect sites vary statistically (e.g., as with a standard normal distribution).

The resistance value of a memory cell in the second initial state is lower than the resistance value of a memory cell in the first initial state, and variance is observed according to probability. In a case where the extent of variance in resistance values due to application of electric stress exceeds the variance of resistance value in the first initial state (e.g., manufacturing variance), application of electric stress may broaden the distribution of resistance values in memory cells in the initial state. It is thought that statistic variance in resistance values occurs in the same way by application of data generation electric stress, in a case of part or all memory cells changing from the initial state to a variable state, as well.

The present inventors have found that this nature can be used to generate numeric data that is intrinsic to each device. For example, multiple resistance values read out from multiple memory cells in the first initial state can be used to generate numeric data intrinsic to each device.

The numeric data may be generated by allocating multiple resistance value information pieces into sets which respectively correspond to a plurality of values constituting the data, based on a predetermined condition. The predetermined condition may be set using multiple resistance value information pieces that have been read.

Embodiments of the present disclosure will be described below with reference to the attached drawings. Note that the embodiment described below is one specific example. Values, shapes, materials, components, placements and connections of components, steps, orders of steps, and so forth, given in the embodiment, are only exemplary, and do not restrict the present disclosure. Components in the following embodiment which are not included in an independent Claim indicating the highest concept are described as being optional components. Components in the drawings which are denoted by the same reference numerals may be omitted from description. The drawings schematically illustrate the components in order to facilitate understanding, so shapes, dimensional ratios, and so forth, may not be accurately shown. In manufacturing methods, the order of the procedures and so forth may be changed as necessary, and further, other known procedures may be added.

Overview of Embodiments

A data generating device according to an aspect of the present disclosure includes: a memory cell array where a plurality of memory cells are disposed in an array form; a read circuit that acquires a plurality of resistance value information pieces from the plurality of memory cells; and a data generator circuit that sets a determination condition using the plurality of resistance value information pieces, and allocates the plurality of resistance value information pieces to a plurality of sets, based on the determination condition, thereby generating data. Each of the plurality of memory cells have a nature where, when in a variable state, the resistance value reversibly changes between a plurality of variable resistance value ranges in accordance with an electric stress applied.

According to this configuration, an unprecedented data generating method can be provided, which is applicable to safer encryption technology, for example.

The determination condition may be set beforehand, for example, or may be dynamically set each time by the data generator circuit.

The data generator circuit may decide which of a first group and a second group to sort each of the plurality of resistance value information pieces to, based on the determination condition. The data generator circuit may output the first value when a resistance value information piece belongs to the first group, and may output the second value when a resistance value information piece belongs to the second group, thereby generating the data consisting of the first value and the second value. The sorting results of the plurality of resistance value information pieces may correspond to values of digits of the data, for example.

The determination condition may be set so that N1 and N2 satisfy the following Expression (1) and Expression (2)

$$\mathrm{erfc}(y) = \int_y^\infty \frac{2}{\sqrt{\pi}} e^{-x^2}\, dx \tag{1}$$

$$\mathrm{erfc}\left(\frac{|N1-N2|}{\sqrt{2(N1+N2)}}\right) \geq 0.01 \tag{2}$$

where N1 represents a number of the first value and N2 represents a number of the second value.

According to this configuration, the memory cells are substantially evenly allocated to the two sets which respectively correspond to the two values. Accordingly, high quality random number data can be generated, for example.

The data generator circuit may set the determination condition such that a difference between N1 and N2 is within a predetermined range that does not include 0.

According to this configuration, some unevenness is intentionally generated in the numbers of the two values. Accordingly, the generated data can pass runs tests and longest runs test more readily.

The "predetermined range" may be a predetermined set value that is not 0. The "predetermined range" may be determined indirectly. For example, the range may be obtained each time by a predetermined arithmetic expression, for example.

The determination condition may use comparison between each of the plurality of resistance value information pieces and a predetermined determination value. The determination value may be a median value of the plurality of resistance value information pieces.

Each of the plurality of memory cells may have a nature that, when in an initial state, each of the plurality of memory cells do not change to the variable state unless forming stress which causes change to the variable state is applied, and also the resistance value is in an initial resistance value range which does not overlap any of the variable resistance value ranges. The determination condition may use comparison between resistance value information and one or more predetermined determination values. At least one of the one or more determination values may correspond to an initial resistance value included in the initial resistance value range.

The data generator circuit may further include a data test circuit that tests data based on a predetermined test condition. In a case where the data test circuit determines that data is non-passable, the data generator circuit may change the determination condition and generate data again.

According to the above configuration, higher quality random number data can be generated.

The "predetermined test condition" may be set indirectly. For example, the threshold values used for tests may be obtained each time by a predetermined arithmetic expression.

The memory cell array may include a plurality of blocks each including a plurality of memory cells. The read circuit may acquire a plurality of resistance value information pieces from the plurality of memory cells, at each block. A data generator circuit may set a determination condition for each block using the plurality of resistance value information pieces acquired at each block, and generate block data for each block by allocating the plurality of resistance value information pieces to the plurality of sets, based on the determination condition, thereby generating the data from the plurality of block data.

According to this configuration, a determination condition is set for each block using the resistance value information read out at each block, so large-scale and high-quality random number data can be generated, for example.

The data generator circuit may decide which of a first group and a second group to sort each of the plurality of resistance value information pieces to, based on the determination condition. The data generator circuit may output the first value when a resistance value information piece belongs to the first group, and may output the second value when a resistance value information piece belongs to the second group, thereby generating the block data consisting of the first value and the second value. The allocation results of the plurality of resistance value information pieces may correspond to values of digits of the data, for example.

Each of the plurality of memory cells may have a nature that, when in an initial state, each of the plurality of memory cells do not change to the variable state unless forming stress which is an electric stress that causes change to the variable state is applied, and also the resistance value is in an initial resistance value range which does not overlap any of the variable resistance value ranges. The determination condition may use comparison between resistance value information and a determination value set to each block. The determination value set to each block may correspond to an initial resistance value included in the initial resistance value range.

The data generator circuit may perform testing of the block data based on a predetermined test condition, and in a case where the block data is determined to be non-passable, may change the determination condition and generate block data again.

The read circuit may acquire a first plurality of resistance value information pieces from the plurality of memory cells, and the data generator circuit may test the first plurality of resistance value information pieces based on a predetermined test condition before generating the block data. In a case where determination is made as a result of the test that the first plurality of resistance value information pieces is non-passable, a voltage application circuit may apply a modification electric stress to at least part of the plurality of memory cells, and the read circuit may acquire a second plurality of resistance value information pieces from the plurality of memory cells as the plurality of resistance value information pieces. In a case where determination is made that the first plurality of resistance value information pieces have passed, the first plurality of resistance value information pieces may be set as the plurality of resistance value information pieces. The modification electric stress may be a data generation electric stress for spreading the distribution of the resistance value information within the initial resistance value range, for example. The predetermined detection condition may test for unevenness in the first plurality of resistance value information pieces, and the unevenness in the second plurality of resistance value information pieces may be smaller than the unevenness in the first plurality of resistance value information pieces.

According to these configurations, testing is performed on data at each block, so large-scale and high-quality random number data can be generated, for example. The "predetermined test value" may be set indirectly beforehand. For example, the test value may be obtained each time by a predetermined arithmetic expression.

The data generator circuit may include an accumulator. The accumulator may obtain at least one of the cumulative number of the first value included in one or more block data that has been generated in the past, the cumulative number of the second value included in the one or more block data, and the difference between the cumulative number of the first value and the cumulative number of the second value. The data generator circuit may set the determination condition for each block using a value obtained by the accumulator.

According to this configuration, large-scale and high-quality random number data can be generated, for example.

The data generating device may include a cumulative test circuit which tests whether at least one value obtained by the accumulator satisfy a predetermined test condition. If the cumulative test circuit determines the data to have failed the test, the data generator circuit may change the determination condition set for the block corresponding to the block data generated last out of one or more block data generated in the past, and thus generate block data again to replace the block data generated last.

According to this configuration, large-scale and high-quality random number data can be generated, for example.

A determination condition corresponding to the block data may be set for each block so that N1 and N2 satisfy the following Expression (3) and Expression (4)

$$\mathrm{erfc}(y) = \int_y^\infty \frac{2}{\sqrt{\pi}} e^{-x^2} \, dx \quad (3)$$

$$\mathrm{erfc}\left( \frac{|N1 - N2|}{\sqrt{2(N1 + N2)}} \right) \geq 0.01 \quad (4)$$

where N1 represents a cumulative number of the first value and N2 represents a cumulative number of the second value.

According to this configuration, the resistance value information pieces are substantially evenly allocated to the two values at each block. Thus, large-scale and high-quality random number data can be generated, for example.

The determination condition corresponding to the block data may be set for each block so that the difference between N1 and N2 is a predetermined range which does not include 0, and N1 and N2 satisfy the following Expression (5) and Expression (6)

$$\mathrm{erfc}(y) = \int_y^\infty \frac{2}{\sqrt{\pi}} e^{-x^2} \, dx \quad (5)$$

$$\mathrm{erfc}\left( \frac{|N1 - N2|}{\sqrt{2(N1 + N2)}} \right) \geq 0.01 \quad (6)$$

where N1 represents a number of the first value and N2 represents a number of the second value included in the block data.

According to this configuration, some unevenness is intentionally generated in the numbers of the two values within the block data. Accordingly, the generated block data can pass runs tests and longest runs test more readily.

The read circuit may acquire the plurality of the resistance value information pieces from the plurality of memory cells after an electric stress, larger than the electric stress applied when reading the resistance values, has been applied to the plurality of memory cells in the initial state. The large electric stress may be forming stress. Alternatively, the large electric stress may be data generation electric stress. In the case of the latter, the data generating device may further include a voltage application circuit to apply the data generation electric stress to the plurality of memory cells.

According to this configuration, high-quality random number data can be generated from the resistance value information pieces in the second initial state, even in a case where the dispersion of resistance values in the first initial state is too small, for example.

The data generating device may include a voltage application circuit that records data in the memory cell array using the difference of whether or not the resistance value of each memory cell is within the initial resistance value range, by applying forming stress to the plurality of memory cells.

According to this configuration, the obtained data can be stably recorded using the difference of whether or not the resistance value of each memory cell is within the initial state. The memory cell array used for generating data also is used for recording data, so the configuration of the device is simplified, and reduction in size of the device can be realized, for example.

The data generating device may include a voltage application circuit that records data in the memory cell array, by applying an electric stress to a plurality of memory cells in a variable state, using the difference of whether or not the resistance value of each memory cell is within at least one variable resistance value range, without using the difference of whether the threshold value of each memory cell is within the initial resistance value range.

According to this configuration, the obtained data can be recorded in a non-volatile manner. The memory cell array used for generating data also is used for recording data, so the configuration of the device is simplified, and reduction in size of the device can be realized, for example.

A data generating method according to an aspect of the present disclosure includes: a step A of acquiring a plurality of resistance value information pieces from a plurality of memory cells included in a memory cell array; a step B of setting a determination condition using the plurality of resistance value information pieces; and a step C of allocating the plurality of resistance value information pieces to a plurality of sets, based on the determination condition, thereby generating data. Each of the plurality of memory cells have a nature where, when in a variable state, the resistance value reversibly changed between a plurality of variable resistance value ranges in accordance with an electric stress applied.

According to this configuration, an unprecedented data generating method can be provided, which is applicable to safer encryption technology, for example.

In step C, which of a first group and a second group to sort each of the plurality of resistance value information pieces to may be decided, based on the determination condition, where the first value is selected when a resistance value information piece belongs to the first group, and the second value is selected when a resistance value information piece belongs to the second group, thereby generating the data consisting of the first value and the second value.

In step B, the determination condition may be set so that N1 and N2 satisfy the following Expression (7) and Expression (8)

$$\mathrm{erfc}(y) = \int_y^\infty \frac{2}{\sqrt{\pi}} e^{-x^2} \, dx \quad (7)$$

-continued $$\mathrm{erfc}\left(\frac{|N1-N2|}{\sqrt{2(N1+N2)}}\right) \geq 0.01 \qquad (8)$$

where N1 represents a number of the first value and N2 represents a number of the second value.

According to this configuration, the resistance value information pieces are substantially evenly allocated to the two values. Accordingly, high quality random number data can be generated, for example.

In step B, the determination condition may be set so that a difference between N1 and N2 is a predetermined range that does not include 0.

According to this configuration, some unevenness is intentionally generated in the numbers of the two values. Accordingly, the generated data can pass runs tests and longest runs test more readily.

The determination condition may use comparison between each of the plurality of resistance value information pieces and a predetermined determination value. In the step B, a median value of the plurality of resistance value information pieces may be set as the determination value.

Each of the plurality of memory cells may have a nature that, when in an initial state, each of the plurality of memory cells do not change to the variable state unless forming stress which causes change to the variable state is applied, and also the resistance value is in an initial resistance value range which does not overlap any of the variable resistance value ranges. The determination condition may use comparison between resistance value information and one or more predetermined determination values. At least one of the one or more determination values may correspond to an initial resistance value included in the initial resistance value range.

The data generating method may further include: a step E of testing data based on a predetermined test condition; and a step F of generating, in a case where step E determines that data is non-passable, data again by changing the determination condition and executing step A, step B, and step C again.

According to the above configuration, higher quality random number data can be generated.

The memory cell array may include a plurality of blocks each including a plurality of memory cells. In step A, a plurality of resistance value information pieces may be acquired from the plurality of memory cells, at each block. In the step B the determination condition for each block may be set using the plurality of resistance value information pieces acquired at each block. In step C, block data for each block may be generated by allocating the plurality of resistance value information pieces to a plurality of sets, based on the determination condition.

According to this configuration, a determination condition is set for each block using the resistance value information read out at each block, so large-scale and high-quality random number data can be generated, for example.

In step C, which of a first group and a second group to sort each of the plurality of resistance value information pieces to may be decided, based on the determination condition. The first value may be selected when a resistance value information piece belongs to the first group, and the second value may be selected when a resistance value information piece belongs to the second group, thereby generating the block data consisting of the first value and the second value.

The allocation results of the plurality of resistance value information pieces may correspond to values of digits of the data, for example.

The determination condition may use comparison between resistance value information and a determination value set to each block. The determination value set to each block may correspond to an initial resistance value included in the initial resistance value range.

The data generating method may further include: a step H of testing whether the plurality of resistance value information pieces satisfy a predetermined test condition; and a step I of causing, in a case that determination is made in step H that the plurality of resistance value information pieces is non-passable, a modification electric stress to be applied to at least part of the plurality of memory cells, wherein step H and step I is performed before step A, step B, and step C.

According to these configurations, testing is performed on data at each block, so large-scale and high-quality random number data can be generated, for example.

Step B may include: a step K of obtaining at least one of the cumulative number of the first value included in one or more block data that has been generated in the past, the cumulative number of the second value included in the one or more block data, and the difference between the cumulative number of the first value and the cumulative number of the second value; and a step L of setting the determination condition to each block using a value obtained in step K.

According to this configuration, large-scale and high-quality random number data can be generated, for example.

The data generating device may further include: a step K of obtaining at least one of the cumulative number of the first value included in one or more block data that has been generated in the past, the cumulative number of the second value included in the one or more block data, and the difference between the cumulative number of the first value and the cumulative number of the second value; a step M of testing whether at least one of the values obtained in step K satisfies the predetermined test condition; and a step N of generating, if the data is determined to have failed the test in step M, block data for a block corresponding to the block data generated last is generated by changing the determination condition for the block and executing step A, step B, and step C, again.

According to this configuration, large-scale and high-quality random number data can be generated, for example.

The determination condition may be that N1 and N2 satisfy the following Expression (9) and Expression (10)

$$\mathrm{erfc}(y) = \int_y^\infty \frac{2}{\sqrt{\pi}} e^{-x^2} dx \qquad (9)$$

$$\mathrm{erfc}\left(\frac{|N1-N2|}{\sqrt{2(N1+N2)}}\right) \geq 0.01 \qquad (10)$$

where N1 represents a cumulative number of the first value and N2 represents a cumulative number of the second value.

According to this configuration, the resistance value information pieces are substantially evenly allocated to the two values at each block. Thus, large-scale and high-quality random number data can be generated, for example.

The determination condition corresponding to the block data may be set for each block so that the difference between N1 and N2 is a predetermined range that does not include 0, and N1 and N2 satisfy the following Expression (11) and Expression (12)

$$\mathrm{erfc}(y) = \int_y^\infty \frac{2}{\sqrt{\pi}} e^{-x^2}\, dx \qquad (11)$$

$$\mathrm{erfc}\left(\frac{|N1-N2|}{\sqrt{2(N1+N2)}}\right) \geq 0.01 \qquad (12)$$

where N1 represents a number of the first value and N2 represents a number of the second value included in the block data.

According to this configuration, some unevenness is intentionally generated in the numbers of the two values within the block data. Accordingly, the generated block data can pass runs tests and longest runs test more readily.

The initial state may include a first initial state where no data generation electric stress has ever been applied, and a second initial state where data generation electric stress has been applied. In step A, a data generation electric stress may be applied to the plurality of memory cells so as to change the memory cells in the first initial state into memory cells in the second initial state, and thereafter the plurality of the resistance value information pieces may be acquired from memory cells in the second initial state.

According to this configuration, high-quality random number data can be generated from the resistance value information pieces in the second initial state, even in a case where the dispersion of resistance values in the first initial state is too small, for example.

The data generating method may further include a step P of recording data in the memory cell array using the difference of whether or not the resistance value of each memory cell is within the initial resistance value range, by applying forming stress to a plurality of memory cells.

According to this configuration, the obtained data can be stably recorded using the difference of whether or not the resistance value of each memory cell is within the initial state. The memory cell array used for generating data also is used for recording data, so the configuration of the device is simplified, and reduction in size of the device can be realized, for example.

The data generating method may further include a step Q of recording data in the memory cell array, by applying an electric stress to multiple memory cells in a variable state, using the difference of whether or not the resistance value of each memory cell is within at least one variable resistance value range, without using the difference of whether the threshold value of each memory cell is within the initial resistance value range.

According to this configuration, the obtained data can be recorded in a non-volatile manner. The memory cell array used for generating data also is used for recording data, so the configuration of the device is simplified, and reduction in size of the device can be realized, for example.

Embodiment

[Configuration of Device]

Figure 2:
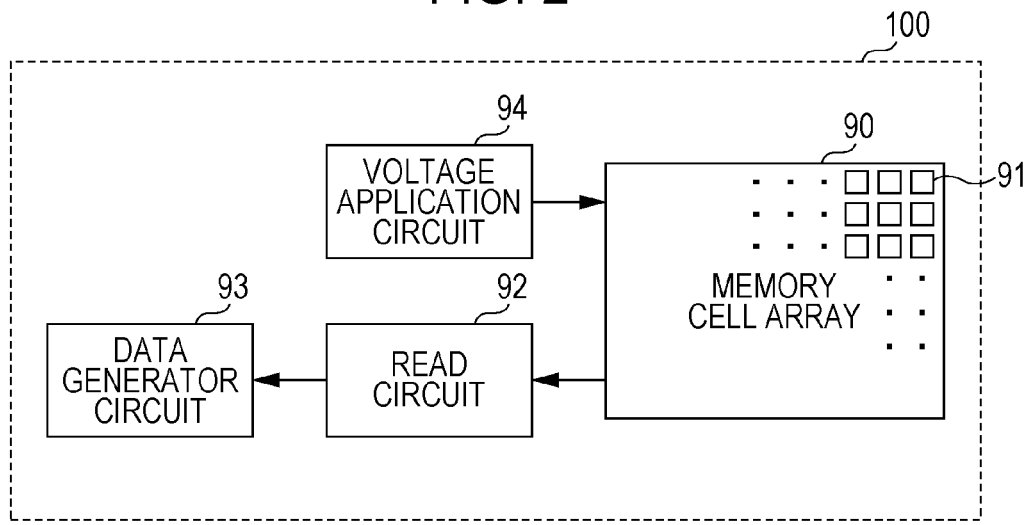
FIG. 2 is a block diagram illustrating an example of a schematic configuration of a data generating device according to an embodiment.
Figure 4:
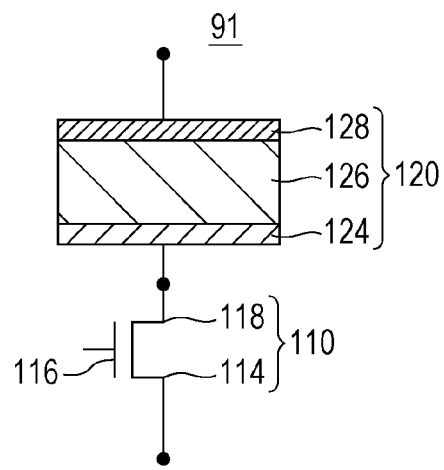
FIG. 4 is a schematic diagram illustrating an example of a schematic configuration of a memory cell according to the embodiment.

FIG. 2 illustrates an example of a schematic configuration of the data generating device according to the embodiment. FIG. 4 illustrates an example of a schematic configuration of a memory cell included in the data generating device according to the embodiment.

A data generating device 100 in the example illustrated in FIG. 2 includes a memory cell array 90, a read circuit 92, a data generator circuit 93, and a voltage application circuit 94. Note that the voltage application circuit 94 is not indispensable, and may be omitted.

The memory cell array 90 is configured with multiple memory cells 91 laid out in the form of an array.

The read circuit 92 acquires resistance value information from each of the multiple memory cells 91. Resistance value information is information having a correlation with resistance values. The resistance value information may be the resistance value itself, or may be a value which increases or decreases according to the resistance value. Examples of values which increase or decrease according to the resistance value include discharge time of a capacitor connected in series or in parallel to a memory cell, a count value corresponding to the discharge time, which will be described later. Note that a capacitor is not restricted to being an element, and may be parasitic capacitance of wiring or the like, for example.

The data generator circuit 93 acquires multiple resistance value information pieces from the multiple memory cells 91 via the read circuit 92. The data generator circuit 93 sets a determination condition using the multiple resistance value information pieces. The data generator circuit 93 selects one value from multiple values for each of the multiple resistance value information pieces, based on the determination condition, and thus generates data. The data generator circuit 93 may assign, as a bit value of the data, the selected value to a predetermined memory address or a part of a register, for example.

The data generator circuit 93 may decide which of a first group and a second group to sort each of the multiple resistance value information pieces to, based on the determination condition. For example, in a case where a resistance value information piece is sorted to the first group, the data generator circuit 93 selects a first value, and in a case where a resistance value information piece is sorted to the second group, the data generator circuit 93 selects a second value. Thus, data consisting of a first value and a second value is generated. This is an example where the number of "multiple values" is two.

In a case where the number of "multiple values" is three, the generated data is ternary data. The number of "multiple values" may be four, or a greater number.

Examples of "data" include random number data, numeric data intrinsic to the data generating device 100, random number data intrinsic to the data generating device 100, and so forth.

Figure 3:
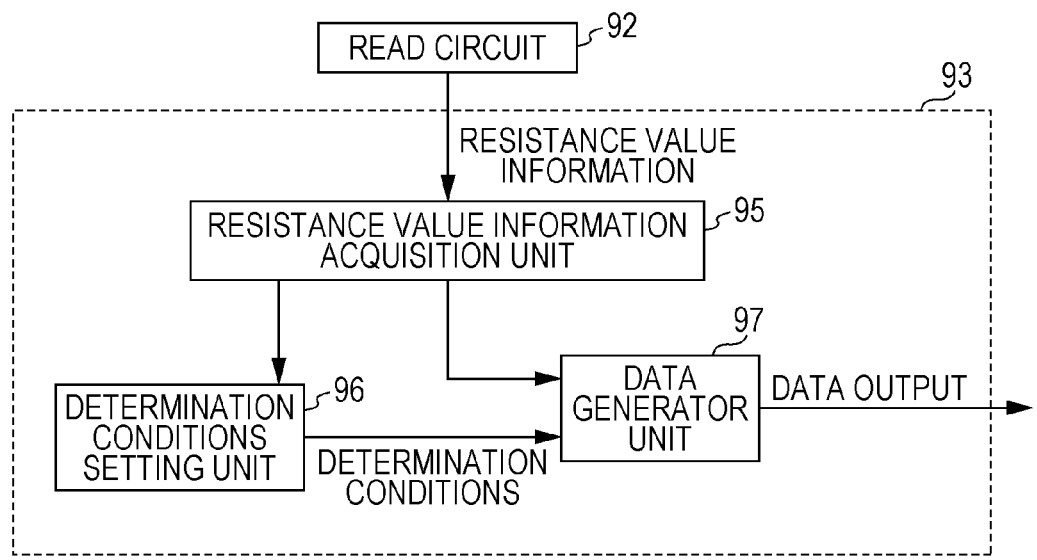
FIG. 3 is a block diagram illustrating an example of a schematic configuration of a data generator circuit according to the embodiment.

FIG. 3 illustrates an example of the schematic configuration of the data generator circuit 93 included in the data generating device 100. The data generator circuit 93 in the example illustrated in FIG. 3 includes a resistance value information acquisition unit 95, a determination condition setting unit 96, and a data generator unit 97. The resistance value information acquisition unit 95 acquires multiple resistance value information pieces from multiple memory cells via the read circuit 92. The determination condition setting unit 96 sets a determination condition using the multiple resistance value information pieces. The data generator unit 97 generates data by selecting one value from multiple values for each of the multiple resistance value information pieces, based on the determination condition.

The memory cell array 90 may have multiple blocks, each including multiple memory cells 91. In this case, the data generator circuit 93 acquires multiple resistance value information pieces for each block via the read circuit 92. Next, the data generator circuit 93 sets a determination condition for each block, using the multiple resistance value information pieces acquired for each block. The data generator circuit 93 then generates block data for each block by selecting one value from multiple values for each of the multiple resistance value information pieces, based on the determination condition. The data generator circuit 93 generates data from the multiple pieces of block data.

The data generator circuit 93 may decide which of a first group and a second group to sort each of the multiple resistance value information pieces to, based on the determination condition. For example, in a case where a resistance value information piece is sorted to the first group, the data generator circuit 93 selects a first value, and in a case where a resistance value information piece is sorted to the second group, the data generator circuit 93 selects a second value. Thus, block data consisting of a first value and a second value may be generated. In a case where the data generator circuit 93 generates block data, the block data may be multi-value data such as ternary data or the like.

The resistance values randomly vary in memory cells in the first initial state (state A), as described by way of FIG. 1. Also, resistance values randomly vary in memory cells where memory cells in the first initial state have received application of data generation electric stress (state B). The data generating device 100 generates data using this feature.

That is to say, the data generating device 100 sets a determination condition using multiple resistance value information pieces, and selects one value for each of the multiple resistance value information pieces using the determination condition. Accordingly, multiple resistance value information pieces are substantially evenly associated with any of the values, for example, so high-quality random data is generated.

In the example illustrated in FIG. 4, a memory cell 91 includes a transistor 110 and a variable resistance element 120. The transistor 110 includes a first main terminal 114, a second main terminal 118, and a control terminal 116. The transistor 110 may be an N-channel metal-oxide semiconductor (NMOS) transistor, for example. In this case, the first main terminal 114 is one of the source and drain, the second main terminal 118 is the other of the source and drain, and the control terminal 116 is the gate terminal, for example. The variable resistance element 120 has a first electrode 124, a variable resistance layer 126, and a second electrode 128. The second main terminal 118 of the transistor 110 and the first electrode 124 of the variable resistance element 120 are connected, thereby connecting the transistor 110 and variable resistance element 120 serially, for example. A configuration example of the variable resistance element 120 will be described later.

The memory cells may not include a transistor in the present disclosure. The memory cells may contain an element other than a transistor, or may be the variable resistance element alone. In a case where the memory cell contains the variable resistance element and another element in the present disclosure, the resistance value of that other element may be disregarded, to facilitate description.

Each of the multiple memory cells 91 has a nature that may take a variable state. A variable state is a state where the resistance value thereof can reversibly change between multiple variable resistance value ranges in accordance with an electric stress applied.

Each of the multiple memory cells 91 may further have a nature of being capable of taking an initial state. An initial state is a state in which the above variable state is not taken forming stress, which is an electric stress to cause change to the variable state, has been applied, and in which the resistance value is in an initial resistance value range which does not overlap any of the above variable resistance value ranges.

Figure 5:
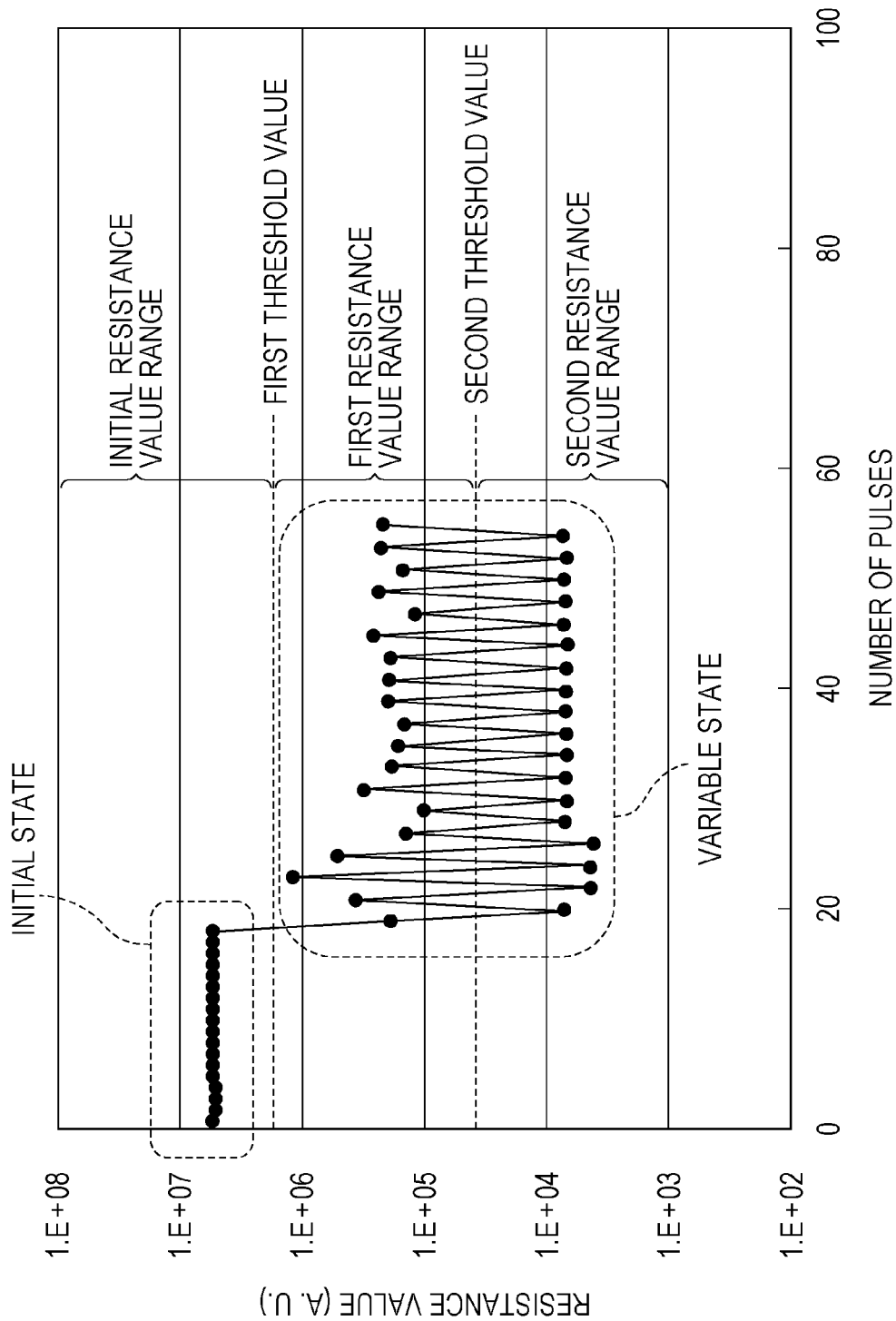
FIG. 5 is a graph illustrating an example of a resistance value range of memory cells according to the embodiment.

FIG. 5 is a graph illustrating an example of a memory cell resistance value range. The memory cells 91 may have a nature of selectively taking at least the two states of the variable state and initial state, as exemplarily illustrated in FIG. 5. Further, the resistance value of the memory cells 91 in the variable state may change between a first resistance value range and a second resistance value range, as exemplarily illustrated in FIG. 5. The electric stress to cause the resistance value of a memory cell 91 to change from the second resistance value range to the first resistance value range may be referred to as "first electric stress", and electric stress to cause the resistance value of the memory cells 91 to change from the first resistance value range to the second resistance value range may be referred to as "second electric stress" in the present disclosure. The first electric stress and the second electric stress are an example of "multiple different electric stresses".

A memory cell in the initial state transitions to the variable state by forming stress being applied. For example, the forming stress may be cumulative stress. In this case, transition is made from the initial state to the variable state when the cumulative amount of stress exceeds a predetermined amount. Note that the memory cells 91 may not elements which can take an initial state. The memory cells 91 may be so-called forming-less elements having only a variable state, for example.

The multiple memory cells 91 within the memory cell array 90 may include memory cells in the variable state and memory cells in the initial state.

The memory cells 91 may remaining in the variable state after manufacturing if forming is not performed. Forming is changing the memory cells by applying a predetermined electric stress to the memory cells so that the resistance values of the memory cells reversibly change between multiple variable resistance value ranges. Electric stress applied for the forming may be electric pulses having a predetermined voltage and duration, or may be a combination of multiple electric pulses, for example. Note that the memory cells 91 may be so-called forming-less elements of which the resistance values reversibly change between multiple variable resistance value ranges, even without forming.

The initial resistance value range may be set so as to include the resistance value of the memory cell 91 immediately after manufacturing, and not include the resistance value of the memory cell 91 which has changed to the variable state. The variable resistance value range may be set so as to not include the initial resistance value range, and include the resistance value of the memory cell 91 which has changed to the variable state. A memory cell having a variable resistance element typically may have the above-described features. The memory cells 91 having these features can be manufactured using various known materials.

The state of a memory cell 91 which has received some sort of electric stress which is not forming stress may be included in the initial state. For example, in a case where a memory cell 91 immediately after manufacturing has received some sort of electric stress that is not forming stress, and the resistance value thereof changes within the initial resistance value range, that state is included in the initial state.

The voltage application circuit 94 may apply data generation electric stress to multiple memory cells 91. The data generation electric stress may be electric stress weaker than the forming stress.

Thereafter, the data generator circuit 93 may obtain multiple resistance value information pieces from the memory cells 91 to which the data generation electric stress has been applied, via the read circuit 92.

In this case, the variance of resistance values of multiple memory cells increases due to the change from state A to state B, as illustrated in FIG. 1 for example, so high-quality random number data can be generated.

The voltage application circuit 94 may record the data generated by the data generator circuit 93 in the memory cell array 90 by applying forming stress to multiple memory cells 91 in the initial state. In this case, the data is recorded using the difference of whether or not the resistance value of each memory cell 91 is within the initial resistance value range.

In this case, data generated by the data generator circuit 93, for example, can be stably recorded using the difference of whether in the initial state or not. For example, using the memory cell array used for generating data, to perform data record as well, can simplify the configuration of the device, and enable reduction in the size of the device.

The voltage application circuit 94 may record data generated by the data generator circuit 93 in the memory cell array 90, by applying an electric stress to multiple memory cells 91 in a variable state. In this case, the data is recorded using the difference of whether or not the resistance value of each memory cell is within at least one variable resistance value range, without using the difference of whether the threshold value of each memory cell is within the initial resistance value range.

In this case, data generated by the data generator circuit 93, for example, can be recorded in a non-volatile manner. For example, using the memory cell array used for generating data, to perform data record as well, can simplify the configuration of the device, and enable reduction in the size of the device.

The read circuit 92 may read out data recorded in the memory cell array 90 by determining whether or not a selected memory cell 91 is in the initial state or variable state.

The configuration of the variable resistance element in the example illustrated in FIG. 5 was as follows. The material of the first electrode 124 was tantalum nitride (TaN), and the material of the second electrode 128 was iridium. The material of the variable resistance layer 126 was a tantalum oxide, and the overall thickness of the variable resistance layer 126 was 50 nm or less. The variable resistance layer 126 had a layered structure of two layers, a first variable resistance layer and a second variable resistance layer, of different oxygen concentrations. The first variable resistance layer comes into contact with the first electrode 124. The first variable resistance layer was a layer with a lower oxygen concentration, having a composition $TaO_x$ where $0<x<2.5$. The second variable resistance layer comes into contact with the second electrode 128. The second variable resistance layer was a layer with a higher oxygen concentration, having a composition $TaO_y$ where $y \geq 2.1$. The thickness of the second variable resistance layer was around 5.5 nm. The area of a contact face of the first electrode 124 and the variable resistance layer 126, and the area of a contact face of the second electrode 128 and the variable resistance layer 126, were both 0.25 $\mu m^2$ or smaller. The forming stress was configured of multiple pulses cumulatively applied to the memory cells. The voltage of each pulse was +3.5 V, and the duration was 5 $\mu s$.

The second electric stress was pulses of which the voltage was −2.4 V and the duration was 50 ns. The first electric stress was pulses of which the voltage was +1.8 V and the duration was 50 ns. Note that in the memory cell structure illustrated in FIG. 4, a case of applying positive voltage to the second electrode 128 with the first electrode 124 as a reference is positive polarity.

As another example, the first electrode 124 and the second electrode 128 may be formed of platinum, and the variable resistance layer 126 formed of an hafnium oxide. The thickness of the variable resistance layer 126 is 30 nm, for example. The shape of the element region of the memory cell 91 may be circular, having a diameter of 3 $\mu m$. In a case where the variable resistance layer 126 is $HfO_{1.6}$, for example, the initial resistance value may be around several megaohms ($M\Omega$), the first resistance value range may be 1000$\Omega$ or more to 3000$\Omega$ or less, and the second resistance value range may be 100$\Omega$ or more to 300$\Omega$ or less. In this case, the forming stress may be multiple pulses where the voltage of each pulse is 2 to 3 V, and the duration is 100 ns, for example. The second electric stress may be pulses of which the voltage is +1.0 V and the duration is 100 ns, for example. The first electric stress may be pulses of which the voltage is −1.3 V and the duration is 100 ns, for example.

In the example illustrated in FIG. 5, the lower limit of the initial resistance value range is equal to or higher than the upper limits of the multiple variable resistance value ranges. For example, the lower limit of the initial resistance value range may be equal to the upper limit of the first resistance value range.

In the example illustrated in FIG. 5, the first threshold value is equal to or lower than the lower limit of the initial resistance value range, and equal to or higher than the upper limits of the multiple variable resistance value ranges. For example, the first threshold value may be equal to the upper limit of the first variable resistance value range. Note that a resistance value having a value equal to the first threshold value may be set to belong to the initial resistance value range, or may be set to belong to the highest of the multiple variable resistance value ranges.

In the example illustrated in FIG. 5, the second threshold value is equal to or lower than the lower limit of the highest variable resistance value range, and also is equal to or higher than the upper limit of the lowest variable resistance value range. For example, the second threshold value is equal to or lower than the lower limit of the first resistance value range, and is equal to or higher than the upper limit of the second resistance value range. Note that a resistance value having a value equal to the second threshold value may be set to belong to the first resistance value range, or the second resistance value range. The first resistance value range and the second resistance value range may be adjacent. That is to say, the value of the smaller of two endpoints stipulating the first resistance value range, and the value of the greater of two endpoints stipulating the second resistance value range, may be the same. Note that a resistance value equal to the second threshold value may be set to belong to a resistance value range including resistance values higher than the second threshold value, or may be set to belong to a resistance value range including resistance values lower than the second threshold value.

On the other hand, there are cases where the resistance value of the memory cells 91 immediately after manufacturing is lower than any of the variable resistance value ranges, depending on the configuration of the memory cells 91. That is to say, there are cases where the initial resistance value range is lower than any of the variable resistance value ranges. For example, this feature is realized in a case where the variable resistance layer in the memory cells 91 is made of an iron oxide.

The resistivity of iron oxides increases in the order of $Fe_3O_4$, FeO, $Fe_2O_3$. For example, the first electrode 124 may be formed of platinum, the second electrode 128 formed of platinum, and the variable resistance layer 126 formed of $Fe_3O_4$. In this case, the overall thickness of the variable resistance layer 126 may be 50 nm or less, for example.

For example, in a case where the contact area of the first electrode 124 and the variable resistance layer 126 is 0.25 $\mu m^2$ or smaller, and the contact area of the second electrode 128 and the variable resistance layer 126 is 0.25 $\mu m^2$ or smaller, the initial resistance value is around 200Ω, which is an extremely low value. Pulses having the same polarity as the first electric stress, and an absolute value of 3.5 V in voltage and 10 $\mu s$ in duration, are applied several times to these memory cells in the initial state, for example. Accordingly, the memory cells maintain a first resistance state where the resistance value is a lower resistance value than the initial resistance value, 2000Ω or higher and 8000Ω or lower, for example. It is thought that this is due to oxidization having progressed at the contact interface of the second electrode 128 and variable resistance layer 126, forming a resistance layer of $Fe_2O_3$ in an insulating state.

The resistance value of memory cells in a variable state can change to a second resistance value range which is 300Ω or higher and 500Ω or lower, by application of second electric stress having an absolute value of 2.4 V for the voltage, for example. Also, the resistance value of memory cells in a variable state can change to the first resistance value range which is 2000Ω or higher and 8000Ω or lower, by application of first electric stress having an absolute value of 2.4 V for the voltage and opposite polarity from the second electric stress.

As another example, the first electrode 124 and the second electrode 128 may be formed from platinum, and the variable resistance layer 126 from a hafnium oxide. The thickness of the variable resistance layer 126 is 30 nm, for example. The shape of the element region of the memory cell 91 may be circular, having a diameter of 3 $\mu m$. In a case where the variable resistance layer 126 is $HfO_{0.9}$, for example, and the resistance value does not change in the initial state, this memory cell may transition to the variable state under application of forming stress of voltage pulses. In this case, the voltage pulses may have voltage of 4 V, and duration of 100 $\mu s$, for example. The resistance value of memory cells in a variable state may change to a second resistance value range of 30Ω or higher and 90Ω or lower, by application of second electric stress having voltage of −1.3 V and duration of 100 ns. Also, the resistance value of memory cells in a variable state may change to a first resistance value range of 100Ω or higher and 300Ω or lower, by application of first electric stress having voltage of +2.0 V and duration of 100 ns.

In this configuration, the upper limit of the initial resistance value range may be equal to or lower than the lower limits of variable resistance value ranges. For example, the upper limit of the initial resistance value range may be equal to the lower limit of the second resistance value range.

The first threshold value may be equal to or higher than the upper limit of the initial resistance value range and also equal to or lower than the lower limits of variable resistance value ranges. The first threshold value may be equal to the lower limit of the second resistance value range, for example.

The second threshold value may be equal to or higher than the lowest variable resistance value range, and also equal to or lower than the highest variable resistance value range. For example, the second threshold value may be equal to or higher than the upper limit of the second resistance value range, and also may be equal to or lower than the lower limit of the first resistance value range. Note that a resistance value equal to the second threshold value may be set to belong to a resistance value range including resistance values higher than the second threshold value, or may be set to belong to a resistance value range including resistance values lower than the second threshold value.

Note that the upper limit and lower limit of neighboring resistance value ranges may not be adjacent. A predetermined margin may be set between neighboring resistance value ranges.

The read circuit 92 may selectively execute a first read mode to determine whether the resistance value of a selected memory cell 91 is higher than the first threshold value or not, and a second read mode to determine whether the resistance value of a selected memory cell 91 is higher than the second threshold value or not. Thus, recorded data is read out. The first threshold value and second threshold value may be fixed value or variable values.

The recorded data may include a first type data and a second type data. The first type data is recorded using the difference in whether or not the resistance value of each memory cell 91 is in the initial resistance value range, for example. The second type data is recorded using the difference in whether or not the resistance value of each memory cell 91 is in at least one variable resistance value range, for example, but does not use the difference in whether or not the resistance value of each memory cell 91 is in the initial resistance value range.

The memory cell array 90 may have a first write address region and a second write address region. In this case, the first type data may be recorded in the first write address region, and the second type data may be recorded in the second write address region. The first write address region and the second write address region may not be separated as physical regions. For example, each memory cell 91 may be sorted into first write address region or second write address region according to a predetermined rule relating to addresses.

The second write address region is a region configured including multiple variable state memory cells, for example. The second write address region may be formed by applying forming stress to multiple memory cells in the initial state, for example. Multiple memory cells in the initial state are included in a predetermined region of the memory cell array 90 immediately after manufacturing, for example. In this case, not only is forming stress used to record the first type data, but also to form the second write address region where the second type data is written.

The first write address region and the second write address region may be set by selectively applying forming stress to the multiple memory cells included in the memory cell array 90. Accordingly, the capacity distribution and placement of these address regions may be freely selected. A partial region of the first write address region may be changed to the second write address region by applying forming stress to the partial region.

The first write address region and the second write address region are disposed within the same memory cell array 90, for example. Accordingly, in a case where information is exchanged between the first write address region and the second write address region, for example, confidentiality of the information can be improved.

The first type data is recorded using the difference in whether or not the resistance value of each memory cell 91 is in the initial resistance value range, for example, and the second type data is recorded using the difference in whether or not the resistance value of each memory cell 91 is in the second resistance value range.

The number of variable resistance value ranges may be three or more. That is to say, the memory cells 91 may serve as multi-value memory.

Note that the initial resistance value range of the variable resistance elements illustrated in FIG. 5 may be set to $2\times10^6\Omega$ or higher but lower than $1.0\times10^7\Omega$, and the two variable resistance value ranges may be set to $5\times10^4\Omega$ or higher but lower than $2\times10^6\Omega$, and $5\times10^3\Omega$ or higher but lower than $5\times10^4\Omega$, for example. At this time, the first threshold value is $2\times10^6\Omega$, for example, and the second threshold value is $5\times10^4\Omega$.

[Configuration of Variable Resistance Element]

Various examples of the configuration of the variable resistance element included in the memory cells will be described. To facilitate description here, a variable resistance element included in a memory cell in the initial state may be referred to as a "variable resistance element in the initial state", and a variable resistance element included in a memory cell in a variable state may be referred to as a "variable resistance element in a variable state". In other words, the state of the memory cell is determined according to the state of the variable resistance element.

In the example illustrated in FIG. 4, the variable resistance layer 126 is located between the first electrode 124 and the second electrode 128. The variable resistance layer 126 may be made of a metal oxide, for example, and more particularly a transition metal oxide, for example. The resistance value of a variable resistance element 120 in a variable state reversibly changes between a plurality of variable resistance value ranges by electric stress applied between the first electrode 124 and the second electrode 128.

The variable resistance layer 126 of a variable resistance element 120 in the initial state may insulate between the first electrode 124 and the second electrode 128. The term "insulate" here means for the resistance value between the first electrode 124 and the second electrode 128 to be 2 M$\Omega$ or higher, for example. The variable resistance layer 126 of a variable resistance element 120 may have a layer formed of an insulator. The term "insulator" here means a material of which the resistivity is 30$\Omega$·m or higher, for example. Forming at least part of the variable resistance layer 126 of a variable resistance element 120 of an insulator enables the resistance properties of the initial state to be stably maintained.

Unlike in the variable state, the resistance value of a variable resistance element in the initial state may be adjusted to a certain degree by the material size, shape, and manufacturing conditions of the variable resistance element, for example. Particularly, in a case where the variable resistance layer 126 has a layered structure, the resistance value may be optionally adjusted by the thickness of a high oxygen concentration layer and oxygen concentration thereof at the time of forming.

This initial state is more stable than the variable state where the resistance value of the variable resistance element changes according to application of electric stress. Accordingly, data can be stably held by using the difference between the initial state and variable state.

The initial resistance value range includes a resistance value obtained by applying a reading electric stress to an element in the initial state, for example. The reading electric stress is smaller than any of the electric stress to change the resistance value of the variable resistance element in the variable state between the multiple variable resistance value ranges, the data generation electric stress, and the forming stress, for example.

Whether or not an electric stress is forming stress is decided by whether or not the object memory cell 91 changes from the initial state to a variable state. Conditions for the object memory cell 91 to change from the initial state to a variable state vary from one memory cell 91 to another. That is to say, the various parameters of the necessary electric stress, for the electric stress to be forming stress, are not absolute fixed values, and may have a certain variance from one memory cell 91 to another. The various parameters are, for example, the magnitude of voltage amplitude applied to the memory cell 91, the pulse duration, and the cumulative application time. This cumulative application time may be equivalent to the sum of pulse duration of the multiple electric pulses applied until the resistance state changes from the initial state to a variable state, for example.

Forming stress typically is stronger than electric stresses that cause the resistance value of a memory cell in a variable state to reversibly change between a plurality of variable resistance value ranges. For example, forming stress may be larger than electric stress applied to change the resistance value of a memory cell in a variable state with regard to at least any of absolute value of voltage, pulse duration, and cumulative application time.

A variable resistance element may be unipolar. The resistance value of a unipolar variable resistance element in a variable state reversibly changes by applying multiple electric stresses of which the voltage and pulse duration, etc., may be different but are of the same polarity. For example, the resistance value of a unipolar variable resistance element changes to a value within the first resistance value range by application of first electric stress at voltage of +2 V and pulse duration of 1 µs, and changes to a value within the second resistance value range by application of second electric stress at voltage of −4 V and pulse duration of 50 ns. As for the polarity of the voltage of the electric signals, the direction of the current from the second electrode 128 to the first electrode 124 was set as positive polarity.

A variable resistance element may be bipolar. The resistance value of a bipolar variable resistance element in a variable state reversibly changes by applying electric stresses of different polarities. For example, the resistance value of a bipolar variable resistance element changes to a value within the first resistance value range by application of first electric stress at voltage of +2 V and pulse duration of 50 ns, and changes to a value within the second resistance value range by application of second electric stress at voltage of −2 V and pulse duration of 50 ns. As for the polarity of the voltage of the electric signals, the direction of the current from the second electrode 128 to the first electrode 124 was set as positive polarity.

In a case where the variable resistance element is bipolar, the first electric stress and second electric stress may differ not only in polarity, but also in pulse duration and absolute value of voltage, for stable operation for example.

In other words, the memory cells according to the present embodiment may be bipolar types regarding which the resistance value reversibly changes by applying multiple electric stresses of different polarities, or may be unipolar types regarding which the resistance value reversibly changes by applying multiple electric stresses of the same polarity.

The variable resistance layer 126 may be formed of a metal oxide. The variable resistance layer 126 may have a layer formed of an oxygen-deficient metal oxide. The metal oxide contained in the variable resistance layer 126 may be at least one of a transition metal oxide and an aluminum oxide. The transition metal oxide may be at least one of a tantalum oxide, iron oxide, hafnium oxide, and zirconium oxide, for example.

Examples of materials of the variable resistance layer of a unipolar variable resistance element include titanium oxides, nickel oxides, aluminum oxides, and so forth. Examples of materials of the variable resistance layer of a bipolar variable resistance element include tantalum oxides, hafnium oxides, aluminum oxides, iron oxides, and so forth.

The variable resistance element may become unipolar or bipolar depending on the combination of variable resistance layer and electrode material, and layer structure of metal oxides and so forth, even if having the variable resistance layer formed of metal oxides of the same type. An example in which the material of the variable resistance layer is a tantalum oxide will be described below in detail. The variable resistance element may exhibit good properties in a case where the variable resistance layer contains a tantalum oxide.

Examples of materials for the first electrode 124 and second electrode 128 include iridium, platinum, tungsten, copper, aluminum, tin nitride (TiN), tantalum nitride (TaN), titanium aluminum nitride (TiAlN), and so forth. While the example in FIG. 4 illustrates the first electrode 124 and the second electrode 128 as having the same area, this is not restrictive. For example, the first electrode 124 may be part of the wiring, and the first electrode 124 and second electrode 128 may be formed to optimal shapes as suitable with the semiconductor process. A foundation layer (omitted from illustration) may be omitted or changed as suitable with the semiconductor process.

The variable resistance layer 126 may be a layered member including a first variable resistance layer connected to the first electrode 124, and a second variable resistance layer connected to the second electrode 128.

The first variable resistance layer may be formed from an oxygen-deficient first metal oxide, and a the second variable resistance layer may be formed of a second metal oxide of which the degree of oxygen-deficiency is smaller than that of the first metal oxide. The second variable resistance layer may be a layer formed from an insulator. For example, a minute local region where the oxygen deficiency reversibly changes in accordance with application of electric pulses is formed in the second variable resistance layer of a variable resistance element in a variable state. The local region can be considered to include a filament configured from oxygen-deficient sites. The local region may be a conductive path traversing the second variable resistance layer. The insulator may be formed of a metal oxide, and the conductive path may be formed of an oxygen-deficient metal oxide of which the oxygen content is lower than that of the insulator.

"Oxygen deficiency" refers to the percentage of the deficient amount of oxygen contained in a certain metal oxide to the amount of oxygen contained in a stoichiometric metal oxide which consists of the same element as the certain metal oxide, where the deficient amount is an amount by subtracting the amount of oxygen contained in the certain metal oxide from that in the stoichiometric metal oxide. Note that if there are multiple stoichiometric metal oxides each of which consists of the same element as a certain metal oxide, the oxygen deficiency of the certain metal oxide is defined using one stoichiometric metal oxide having the largest resistance value among the multiple stoichiometric metal oxides. A stoichiometric metal oxide is more stable as compared with metal oxides of other compositions, and has a higher resistance value.

For example, in a case where the metal is tantalum, the stoichiometric oxide according to the above-described definition is $Ta_2O_5$, which can be written as "$TaO_{2.5}$". The oxygen deficiency of $TaO_{2.5}$ is 0%, while the oxygen deficiency of $TaO_{1.5}$ can be calculated as $(2.5-1.5)/2.5=40\%$. On the other hand, the oxygen deficiency in oxygen-excessive metal oxides is indicated by a negative value. The oxygen deficiency will be described as including positive values, 0, and negative values in the present disclosure, unless specifically stated otherwise.

An oxide with less oxygen deficiency is closer to the stoichiometric oxide, and accordingly the resistance value is higher. An oxide with more oxygen deficiency is closer to the metal contained in the oxide, and accordingly the resistance value is lower.

"Oxygen content" is the percentage of oxygen atoms in the total number of atoms. For example, the oxygen content of $Ta_2O_5$ is 71.4 atm % from the percentage of oxygen atoms in the total number of atoms (O/(Ta+O)). Accordingly, the oxygen content of an oxygen-deficient tantalum oxide is larger than 0, but smaller than 71.4 atm %. For example, in a case where the metal contained in the first metal oxide and the metal contained in the second metal oxide are the same type, the oxygen content correlates to the oxygen deficiency. That is to say, in a case where the oxygen content of the second metal oxide is larger than the oxygen content of the first metal oxide, the oxygen deficiency of the second metal oxide is smaller than the oxygen deficiency of the first metal oxide.

The metal element contained in the metal oxide within the variable resistance layer is not restricted to tantalum, and may be other metals. Examples of such metal elements include at least one of transition metal and aluminum. Examples of transition metals include tantalum, titanium, hafnium, zirconium, niobium, tungsten, nickel, iron, and so forth. Transition metals may take multiple oxide states, and accordingly can change to multiple different resistive states by redox reaction.

For example, the variable resistance layer 126 may be formed of hafnium oxide. In this case, the composition of the first metal oxide may be $HfO_x$, for example, where x is 0.9 or larger but 1.6 or smaller, and the composition of the second metal oxide may be $HfO_y$ where y is larger than the value of x. Accordingly, the resistance value of the variable resistance layer is stable, and can change quickly. The thickness of the second metal oxide may be 3 nm or more but 4 nm or less.

The variable resistance layer 126 may be formed of zirconium oxide. In this case, the composition of the first metal oxide may be $ZrO_x$, where x is 0.9 or larger but 1.4 or smaller, and the composition of the second metal oxide may be $ZrO_y$ where y is greater than the value of x. Accordingly, the resistance value of the variable resistance layer is stable, and can change quickly. The thickness of the second metal oxide may be 1 nm or more but 5 nm or less.

A first metal contained in the first metal oxide, and a second metal contained in the second metal oxide, may be different. In this case, the second metal oxide may have a smaller oxygen deficiency as compared to the first metal oxide. In to her words, the second metal oxide may have a higher resistivity as compared to the first metal oxide. This configuration causes a greater part of voltage applied between the first electrode 124 and the second electrode 128 to be distributed to the second metal oxide, so the redox reaction occurs more readily in the second metal oxide.

The first metal contained in the first metal oxide contained in the first variable resistance layer, and the second metal contained in the second metal oxide contained in the second variable resistance layer, may be different metals from each other. In this case, the standard electrode potential of the second metal may be lower than the standard electrode potential of the first metal. The standard electrode potential represents oxidization properties. The higher the standard electrode potential of the metal is, the less readily oxidization occurs. Accordingly, the redox reaction occurs more readily at the second metal oxide where the standard electrode potential is relatively low.

For example, the first metal oxide may be an oxygen-deficient tantalum oxide ($TaO_x$) and the second metal oxide may be a titanium oxide ($TiO_2$). The standard electrode potential of titanium is −1.63 eV, while the standard electrode potential of tantalum is −0.6 eV. Thus, in a case where the standard electrode potential of the second metal oxide is lower than the standard electrode potential of the first metal oxide, the redox reaction occurs more readily in the second metal oxide. Accordingly, stable resistance change operations can be yielded. As another combination example of the first metal oxide and the second metal oxide, the first metal oxide may be an oxygen-deficient tantalum oxide ($TaO_x$), and the second metal oxide may be an aluminum oxide ($Al_2O_3$).

The material of the second electrode 128 which comes into contact with the second metal oxide may have a standard electrode potential that is higher than the metal contained in the second metal oxide and the material contained in the first electrode 124. Examples of the material of the second electrode 128 include platinum, iridium, palladium, and so forth. The standard electrode potential of the material of the first electrode 124 which comes into contact with the first metal oxide may be lower than that of the metal contained in the first metal oxide. Examples of the material of the first electrode 124 include tungsten, nickel, tantalum, titanium, aluminum, tantalum nitride (TaN), titanium nitride (TiN), and so forth.

That is to say, with the standard electrode potential of the second electrode 128 represented by V2, the standard electrode potential of the metal contained in the second metal oxide as Vr2, the standard electrode potential of the metal contained in the first metal oxide as Vr1, and the standard electrode potential of the first electrode 124 as V1, V1, V2, Vr2, and Vr1 may satisfy a relationship of Vr2<V2 and V1<V2, and further a relationship of V2>Vr2, and Vr1≥V1. Accordingly, the redox reaction can be made to selectively occur in the second metal oxide near the interface of the second electrode 128 and the second metal oxide. Accordingly, a stable resistance change phenomenon is realized.

The variable resistance layer 126 includes a first variable resistance layer having a composition expressed by $TaO_x$ (where 0≤x<2.5), and a second variable resistance layer having a composition expressed by $TaO_y$ (where x<y<2.5), for example. The variable resistance layer 126 may further include other layers. Other layers may be formed of a metal oxide other than a tantalum oxide.

In the first variable resistance layer, x may further satisfy 0.8≤x<1.9. In the second variable resistance layer, y may further satisfy 2.1≤y<2.5. The thickness of the second tantalum oxide layer may be 1 nm or more and 8 nm or less, for example. The direction of resistance change in bipolar elements is decided by the variable resistance layer including multiple layers with different oxygen deficiencies. For example, a structure will be assumed where the second variable resistance layer is situated on the second electrode 128 side, and the first variable resistance layer is situated in the first electrode 124 side. When voltage is applied in the direction of current flowing from the second electrode 128 side to the first electrode 124 side, the resistance value of the variable resistance element is high, and when voltage is applied in the direction of current flowing in the reverse direction, the resistance value is low. Alternatively, the second variable resistance layer may be in contact with the first electrode 124, and the first variable resistance layer may be in contact with the second electrode 128. In this case, the relationship between the change in resistance and the direction of applying voltage is inverted.

The resistance change of the variable resistance element in the variable state occurs due to change in the filament in a local region within the variable resistance layer 126. This local region was found to be, for example, 30 nm or less in diameter, and further 10 nm or less, under observation by cross-sectional analysis. This is smaller than the process limitation for leading-edge lithography semiconductor processes. That is to say, the local region including the filament is not readily affected by process variances. Accordingly, the variable resistance element can maintain stable resistance change properties even when formed very finely.

The variable resistance layer of the variable resistance element is formed, without having been subjected to thermal processing exceeding several hundred degrees Celsius. Accordingly, deterioration of the properties of the C-MOS transistor due to the thermal process can be avoided. The variable resistance element has higher affinity with the semiconductor process, in comparison with memory devices using floating gate transistors such as flash memory or the like. Accordingly, there is little concern that advancement in the fineness of manufacturing processes will lead to deterioration in reliability of resistance change. Accordingly, even when a logic circuit such as a control circuit or the like and a variable resistance element are formed on the same chip, the variable resistance element can be formed while suppressing affecting the features of the logic circuit. The same fabrication process may be shared for the logic circuit and the variable resistance element, thereby reducing manufacturing costs.

[Mechanism of Variance in Resistance Values]

The resistance change phenomenon at the variable resistance layer having the layered structure is thought to be manifested as follows. The second metal oxide layer having a high resistance value includes minute local regions in the variable state. Redox reaction occurs in these local regions, and the filaments, or electroconductive paths, in the local regions change. Accordingly, the resistance value in a local region changes.

For example, in a case of applying positive voltage to the second electrode 128 that is in contact with the second metal oxide layer, with the first electrode 124 as a reference, oxygen ions in the resistive layer are drawn to the second metal oxide side layer. Accordingly, oxidization reaction occurs in the minute local regions in the second metal oxide layer, and the oxygen deficiency in the local regions decreases. This consequently reduces the number or width of filaments in the local regions, which is thought to be the reason why the resistance value increases.

On the other hand, when negative voltage is applied to the second electrode 128 that is in contact with the second metal oxide layer, with the first electrode 124 as a reference, oxygen ions in the second metal oxide layer are driven to the first metal oxide side layer. Accordingly, reducing reaction occurs in the minute local regions in the second metal oxide layer, and the oxygen deficiency in the local regions increases. This consequently increases the number or width of filaments in the local regions, which is thought to be the reason why the resistance value decreases.

Figure 6:
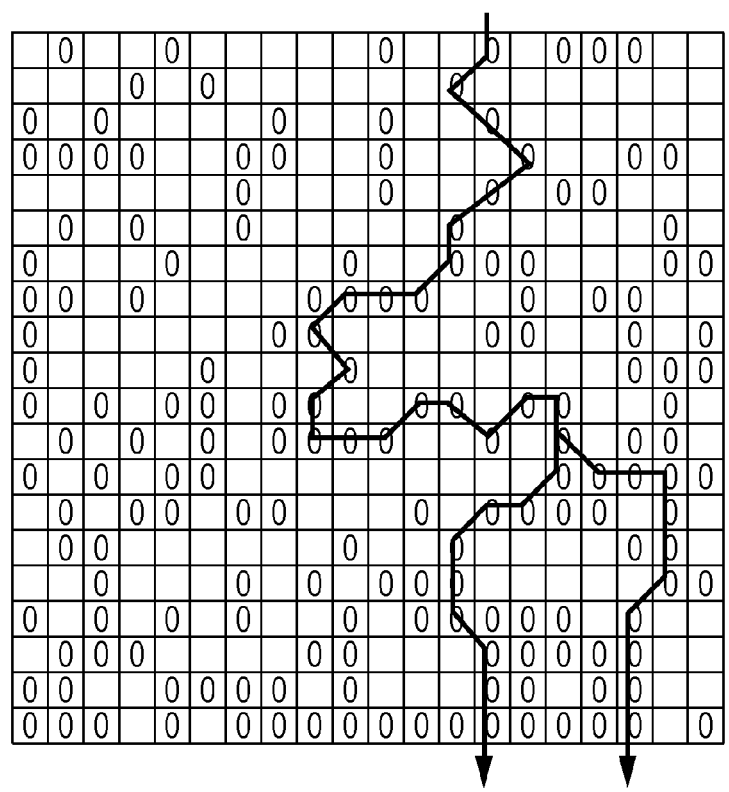
FIG. 6 is a diagram illustrating an example of simulation results of formation of a filament within a variable resistance layer (e.g., a local region), using a percolation model.

FIG. 6 illustrates an example of the results of simulating formation of a filament in a variable resistance layer (e.g., location region) using a percolation model. This assumes an example of a string of connected defect sites being formed by defect sites regarding oxygen in the variable resistance layer being connected. A percolation model is a model based on the theory that the greater the density of defect sites randomly distributed through the variable resistance layer is, the greater the probability is that a string of defects sites will be formed. Here, the term "defect" means that oxygen is lacking from the metal oxide, and "density of defect sites" is an amount corresponding to the oxygen deficiency. That is to say, the greater then oxygen deficiency is, the greater the density of defect sites will be.

In the simulation illustrated in FIG. 6, oxygen ion sites in the variable resistance layer are approximately assumed as regions, or sites, partitioned in a grid. A string of connected defect sites that occurs according to probability was obtained by simulation, based on the assumption. The sites containing "0"s in FIG. 6 represent defect sites formed in the variable resistance layer. On the other hand, the blank sites represent sites occupied by oxygen ions. Being occupied by oxygen ions means that the resistance of the site is high in that region. The arrows indicate the connection of defect sites, connected with each other within a range of one site in the vertical, horizontal, or diagonal directions. This string of connected sites is the path over which current flows within the variable resistance layer. The path carrying the current between the upper face and lower face of the variable resistance layer, for example, contains a cluster of defect sites, continuing from the upper edge to the lower edge through the randomly-distributed defect sites, as illustrated in FIG. 6. According to this percolation mode, the number and shapes of strings of connected defect sites formed are according to probability. As a result, the resistance values in the variable resistance layer vary.

When a predetermined electric stress is applied to a variable resistance element in the initial state, the density of defect sites changes at a partial region of the variable resistance layer, and a string of connected defect sites is formed. In a case where the variable resistance layer contains a metal oxide, the placement of defect sites in the variable resistance layer is random, and differs from one element to another. Distances between defect sites and so forth, which are a barrier to forming strings of connected defect sites, vary randomly from one element to another. Accordingly, even in a case where a common electric stress is applied to multiple elements, the number and shape of the strings of connected defect sites formed thereby vary from one memory cell to another. It is thought that the resistance values randomly change between a plurality of memory cells as a result thereof.

The greater the electric stress applied to the variable resistance elements in the initial state is, the greater the number and/or diameter of strings of connected defect sites within the variable resistance layer is. When these exceed a predetermined threshold value, the variable resistance element enters a variable state. That is to say, a variable resistance element in the second initial state or variable state may have variance in resistance value based on the irregularity of the strings of connected defect sites. Note that the strings of connected defect sites when the variable resistance element is in a variable state may be referred to as "filament" in particular, in the present disclosure. Note that there are cases where variable resistance elements in the first initial state have variance in resistance values based on manufacturing variance.

If a material is used in which filaments can be formed by defects sites of oxygen or the like, variance in resistance value can occur the same way among multiple memory cells. Accordingly, even in a case where multiple layers included in the variable resistance layer contain oxides of metals that are difference from each other, a similar mechanism can be expected.

[Data Generation Method]

Figure 7:
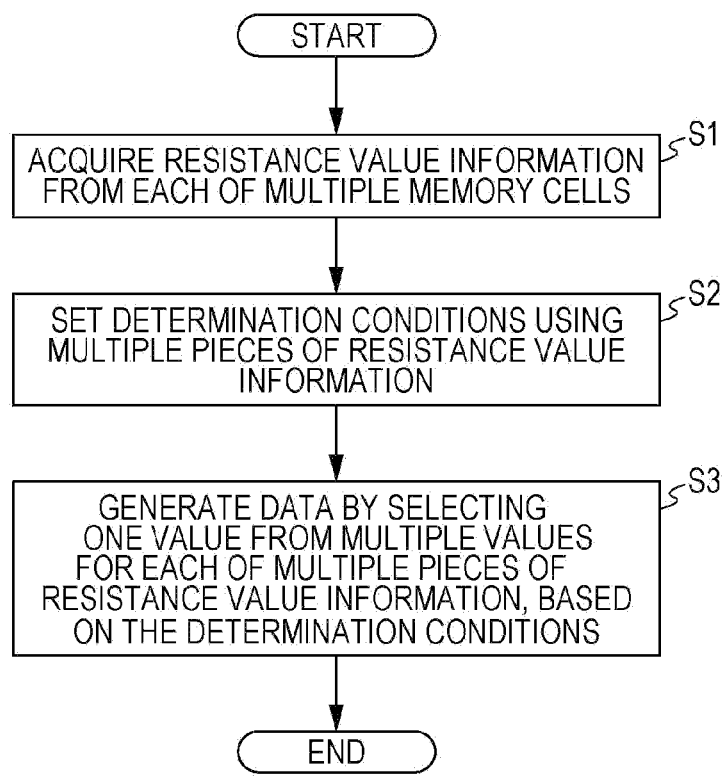
FIG. 7 is a flowchart illustrating an example of a data generating method according to the embodiment.

FIG. 7 is a flowchart illustrating an example of the data generation method according to the embodiment. An example of the data generation method according to the embodiment will be described below with reference to FIG. 7. This operation may be started by a predetermined command being input to the data generator circuit 93, for example.

Upon the data generation process being started (Start), resistance value information is acquired from each of multiple memory cells 91 (step S1).

A determination condition is then set using the obtained multiple resistance value information pieces (step S2).

Finally, one value is selected from multiple values for each of the resistance value information pieces, based on the determination condition, thereby generating data (Step S3), and the data generation process ends (end).

Step S3 may be carried out such that which of a first group and a second group to sort each of the multiple resistance value information pieces to is decided, based on the determination condition. For example, the first value may be selected when a resistance value information piece belongs to the first group, and the second value may be selected when a resistance value information piece belongs to the second group, thereby generating data.

[Exemplification of Determination Condition]

In a case where the "multiple values" is two types of a first value and a second value, the determination condition may be set such that the number of first values, N1, and the number of second values, N2, satisfy the following Expression (13) and Expression (14).

$$\mathrm{erfc}(y) = \int_y^\infty \frac{2}{\sqrt{\pi}} e^{-x^2} dx \tag{13}$$

$$\mathrm{erfc}\left(\frac{|N1 - N2|}{\sqrt{2(N1 + N2)}}\right) \geq 0.01 \tag{14}$$

In this case, the memory cells are substantially evenly sorted to each of the two values, whereby high-quality random number data can be generated, for example.

The determination condition may be set so that the difference between N1 and N2 is a predetermined set value that is not 0. In this case, the sorting to the two values can be intentionally biased. Accordingly, in a case where the generated data is random number data, the random number data can be adjusted so as to pass the runs test and longest runs test more easily.

The determination condition may use comparison between resistance value information and a predetermined determination value. The determination value may be a median value of the multiple resistance value information pieces. This comparison with a predetermined determination value may be an operation where the first value is selected in a case where the resistance value information piece is the determination value or higher, and the second value is selected in a case where the resistance value information piece is lower than the determination value. Which of the first value and the second value to select in a case where the resistance value is equal to the determination value is optional.

A median value is a value situated at the middle of a finite number of values, e.g., resistance value information pieces, arrayed in ascending order. For example, if there are 2n+1 values, where n is an integer of 0 or more, the median value is the n+1'th value when counted from the smaller side. If there are 2n values, where n is an integer of 1 or more, the median value is the n'th value or the n+1'th value when counted from the smaller side, or the arithmetic mean of the n'th value and n+1'th value when counted from the smaller side.

In a case where the memory cells 91 have a nature of being able to take the initial state, the determination condition may use comparison between the resistance value information and predetermined determination value, and also at least one determination value may be included in the initial resistance value range.

Block data may be generated by multiple resistance value information pieces being read out for each block, and the determination condition being set for each block. For example, assumption will be made that the number of a first value included in block data is N1, and the number of a second value is N2. In this case, the determination condition set for each block may be set such that the difference between N1 and N2 is a predetermined set value that is not 0, and also N1 and N2 satisfy the following Expression (15) and Expression (16).

$$\mathrm{erfc}(y) = \int_y^\infty \frac{2}{\sqrt{\pi}} e^{-x^2} dx \qquad (15)$$

$$\mathrm{erfc}\left(\frac{|N1-N2|}{\sqrt{2(N1+N2)}}\right) \geq 0.01 \qquad (16)$$

In a case where block data is generated, the determination condition set for each block may be such that uses comparison between resistance value information and determination values set for each block. Further, the determination value set to each block may be included in the initial resistance value range.

The data generator circuit 93 may include an accumulator. The accumulator may obtain at least one of the cumulative number of the first value included in one or more block data that has been generated in the past, the cumulative number of the second value included in the one or more block data, and the difference between the cumulative number of the first value and the cumulative number of the second value. The difference between the cumulative number of the first value and the cumulative number of the second value may be obtained from the cumulative number of the first value and the cumulative number of the second value, or may be made by accumulating the difference between the number of the first value and the number of the second value for each block.

A determination condition set to each block may be set using a value obtained by the accumulator. The accumulator may output obtained values or predetermined commands based thereupon to the determination condition setting unit 96.

[Data Tests and Data Regeneration]

The data generator circuit 93 may further include a data test circuit that tests data based on a predetermined test condition. In a case where the data test circuit determines that data is non-passable, the data generator circuit 93 may change the determination condition and generate data again.

The data generator circuit 93 may include the accumulator and a cumulative test circuit. The accumulator may accumulate at least one of the cumulative number of the first value and number of second value included in one or more block data that has been generated in the past. Alternatively, the accumulator may obtain the difference between the cumulative number of the first value and the cumulative number of the second value included in one or more block data that has been generated in the past. The cumulative test circuit may test whether the values obtained by the accumulator satisfy a predetermined test condition.

In this case, if the cumulative test circuit determines the data to be non-passable, the data generator circuit 93 may regenerate the block data that was generated last. At this time, the data generator circuit 93 may reset the determination condition for the block corresponding to the block data generated last, and thus generate block data again.

The cumulative test circuit may test whether the values obtained by the accumulator satisfy a predetermined test condition, and output the results of the test, or predetermined commands based thereupon, to the determination condition setting unit 96, for example. With the number of first values as N1, and the number of second values as N2, the following Expression (17) and Expression (18) may be satisfied.

$$\mathrm{erfc}(y) = \int_y^\infty \frac{2}{\sqrt{\pi}} e^{-x^2} dx \qquad (17)$$

$$\mathrm{erfc}\left(\frac{|N1-N2|}{\sqrt{2(N1+N2)}}\right) \geq 0.01 \qquad (18)$$

[Testing Data and Reapplying Electric Stress]

The data generator circuit 93 may include a block data test circuit. The block data test circuit may test block data by testing whether or not the number of the first value contained in the block data is equal to or larger than a predetermined test value.

In a case where the block data test circuit determines that the block data is non-passable, the voltage application circuit 94 may apply electric stress to increase the number of the first value, to at least part of the memory cells in the block. Thereafter, the data generator circuit 93 may regenerate the block data.

The block data test circuit acquires block data generated at the data generator unit 97, for example, and test this block data. In a case where the block data passes the test, the block data test circuit may permit the block data to be externally output. Alternatively, in a case where the data generator circuit 93 includes an accumulator, the block data test circuit may output this block data to the accumulator. In a case where the block data is non-passable, the block data test circuit may output a command to the voltage application circuit 94 to apply electric stress, and output a command to execute readout to the read circuit 92.

[Operation Modes and Commands]

The data generating device 100 may have multiple operation modes. For example, the data generating device 100 executes modes based on externally-received commands.

The data generating device 100 may directly or indirectly execute a first write mode, a second write mode, a first read mode, and a second read mode, for example. In the first write mode, data is written to the memory cell array 90 using the difference between whether each memory cell 91 is in the initial state or a variable state. In the second write mode, data is written to the memory cell array 90 using the difference in whether or not the resistance value of each memory cell 91 is in at least one variable resistance value range, without using the difference in whether or not the resistance value of each memory cell 91 is in the initial resistance value range. In the first read mode, data is read using the difference between whether each memory cell 91 is in the initial state or a variable state. In the second read mode, data is read using the difference in whether or not the resistance value of each memory cell 91 is in at least one variable resistance value range, without using the difference in whether or not the resistance value of each memory cell 91 is in the initial resistance value range. For example, in a case where the memory cells 91 included in the memory cell array 90 have the properties illustrated in FIG. 5, the modes may be executed as follows, for example.

For example, in the first write mode, forming stress is applied to memory cells 91 to which "1" should be recorded, and electric stress is not applied to memory cells 91 to which "0" should be recorded. A command to cause the data generating device 100 to execute the first write mode, externally input to the data generating device 100, is called a first write command, for example. Data is read by determination using a first threshold value in the first read mode, for example. A command to cause the data generating device 100 to execute the first read mode, externally input to the data generating device 100, is called a first read command, for example.

For example, in the second write mode, second electric stress is applied to memory cells 91 to which "1" should be recorded, and first electric stress is applied to memory cells 91 to which "0" should be recorded. A command to cause the data generating device 100 to execute the second write mode, externally input to the data generating device 100, is called a second write command, for example. Data is read by determination using a second threshold value in the second read mode, for example. A command to cause the data generating device 100 to execute the second read mode, externally input to the data generating device 100, is called a second read command, for example.

The data generating device 100 may execute a third read mode, which will be described later. Resistance value information of multiple memory cells 91 is acquired in the third read mode. Determination based on a threshold value is not performed in the third read mode. Note however, that a determination for generating data may be executed by the data generating device 100 after having executed the third read mode.

It is sufficient for the data generating device 100 to be able to execute at least the third read mode, with the first read mode, second read mode, first write mode, second write mode, and other modes, being set as appropriate depending on necessity.

Exemplary Embodiment

[Data Generating Device]

Figure 8:
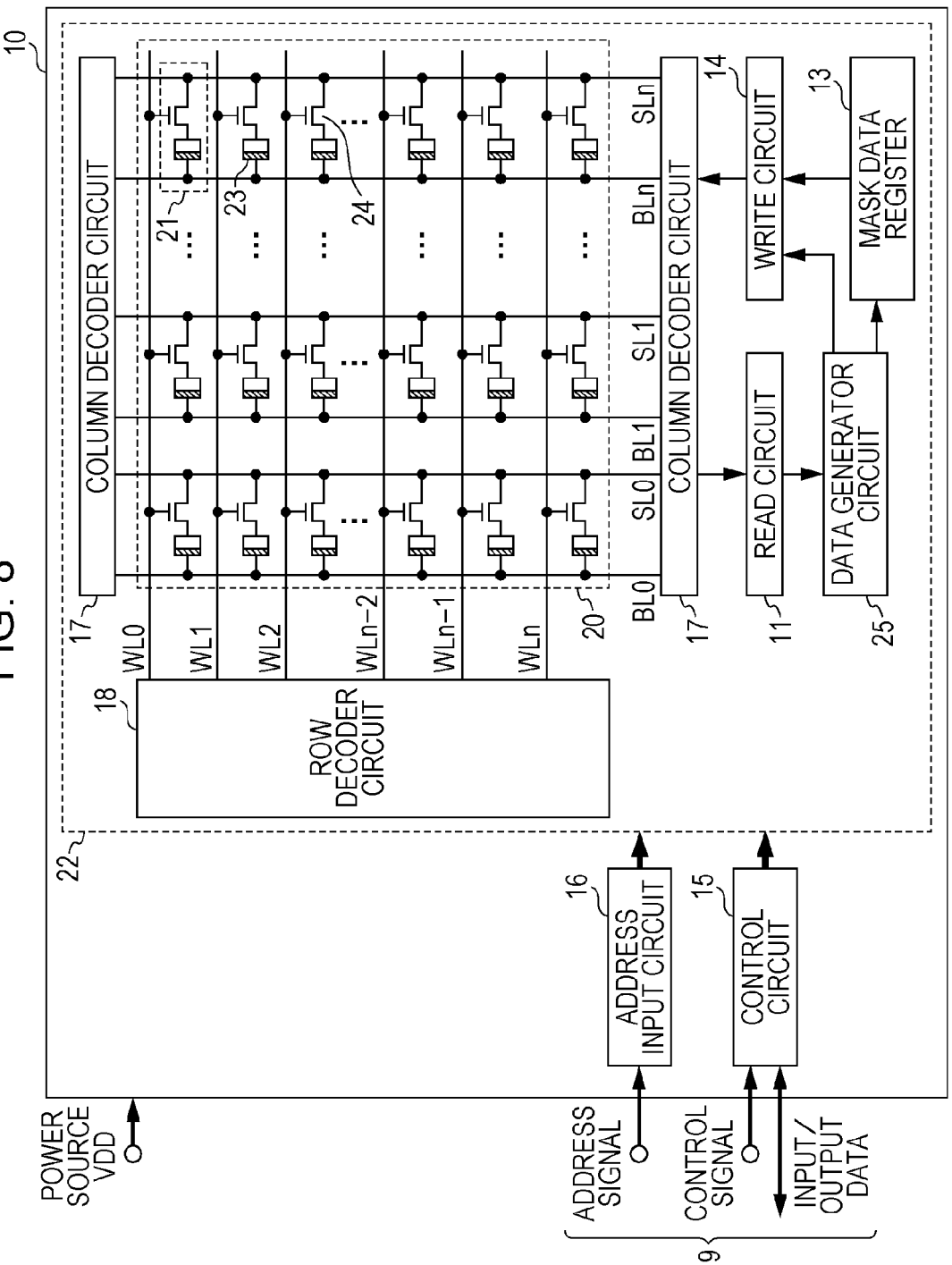
FIG. 8 is a block diagram illustrating an example of a schematic configuration of a data generating device according to an exemplary embodiment.

FIG. 8 illustrates an example of a schematic configuration of a data generating device according to an exemplary embodiment. It should be noted that the specific configuration of the data generating device according to the embodiment is not restricted to the configuration illustrated in FIG. 8.

A data generating device 10 according to the exemplary embodiment has a main memory unit 22 on a semiconductor substrate, as illustrated in FIG. 8. The main memory unit 22 includes a memory cell array 20, a row decoder circuit 18, a column decoder circuit 17, a write circuit 14, and a read circuit 11. The row decoder circuit 18 selects, from multiple word lines WL connected to the memory cell array 20, one word line WL. The column decoder circuit 17 selects, from multiple bit lines BL and multiple source lines SL, one bit line BL and one source line SL, and applies a predetermined voltage for each operation. The write circuit 14 executes writing of data to a selected memory cell 21. The read circuit 11 detects the amount of current flowing over the bit line BL, and outputs information of the selected memory cell as a count value. The count value is an example of "resistance value information". The write circuit 14 is an example of a "voltage application circuit". The write circuit 14 may apply, for example, data generation electric stress and/or forming stress to the selected memory cell 21. There are cases where these electric stresses are not for writing data. However, circuits which apply electric stress of which the object is not to write data may also be referred to as "write circuit" for the sake of convenience.

The data generating device 10 further includes a data generator circuit 25, a mask data register 13, an address input circuit 16, and a control circuit 15. The data generator circuit 25 generates data based on the count value output from the read circuit 11. The mask data register 13 stores information of mask data based on the data generated by the data generator circuit 25. The address input circuit 16 receives address signals input externally to the data generating device 10. The control circuit 15 receives control signals input externally to the data generating device 10, and controls the operations of the main memory unit 22 based thereupon.

The memory cell array 20 includes multiple word lines WL0, WL1, WL2, . . . WLn, multiple bit lines BL0, BL1, . . . BLn, and multiple source lines SL0, SL1, . . . SLn. The multiple word lines WL0, WL1, WL2, . . . WLn extend parallel to each other. The multiple bit lines BL0, BL1, . . . BLn extend in parallel to each other, and three-dimensionally intersect the multiple word lines WL0, WL1, WL2, . . . WLn. The multiple source lines SL0, SL1, . . . SLn extend in parallel to each other, and three-dimensionally intersect the multiple word lines WL0, WL1, WL2, . . . WLn. The multiple source lines SL0, SL1, . . . SLn may extend in parallel with the multiple bit lines BL0, BL1, . . . BLn. A memory cell 21 is positioned at each three-dimensional intersection of the multiple word lines WL0, WL1, WL2, . . . WLn and the multiple bit lines BL0, BL1, . . . BLn.

Each memory cell 21 has a variable resistance element 23 and a transistor 24. The word lines WL0, WL1, WL2, . . . WLn are each connected to the gate terminal of respective transistors 24. The bit lines BL0, BL1, . . . BLn are each connected to a second electrode of respective variable resistance elements 23. The first electrode of the variable resistance elements 23 is connected to a second main terminal of respective transistors 24. The source lines SL0, SL1, . . . SLn are each connected to a first main terminal of respective transistors 24.

The variable resistance element 23 operates as a non-volatile storage element in the memory cell 21. Each memory cell 21 in the data generating device 10 is configured including one transistor 24 and one variable resistance element 23.

Upon the address input circuit 16 receiving an address signal, the row decoder circuit 18 selects one word line from the multiple word lines WL0, WL1, WL2, . . . WLn, and the column decoder circuit 17 selects one set of bit line and source line from the multiple bit lines BL0, BL1, . . . BLn and source lines SL0, SL1, . . . SLn. Thus, a memory cell 21 corresponding to the address signal is selected.

Upon the control circuit 15 receiving a control signal, one line of the selected set of bit line and source line is connected to the write circuit 14 if writing or the read circuit 11 if reading, via the column decoder circuit 17. Thereafter, the control circuit 15 drives the write circuit 14 or read circuit 11.

The variable resistance element 23 may be of the same configuration as the variable resistance element 120 described in the embodiment. The select transistors included in the memory cell array 20 are NMOS transistors in the example illustrated in FIG. 8.

An external interface 9 includes a terminal to which address signals are input, a control terminal to which control signals are input, and a terminal where input/output data is input and output. The external interface 9 may be connected to an external forming device, for example. In this case, the external forming device may control the data generating device 10 via the external interface 9. The external interface 9 may be connected to a microcomputer also installed with the data generating device 10. In this case, the microcomputer may control the data generating device 10 via the external interface 9. While description has been made in FIG. 8 regarding a configuration where the forming device or microcomputer is outside of the data generating device 10 for sake of simplicity, these may be contained within the data generating device 10.

[Read Circuit]

Figure 9:
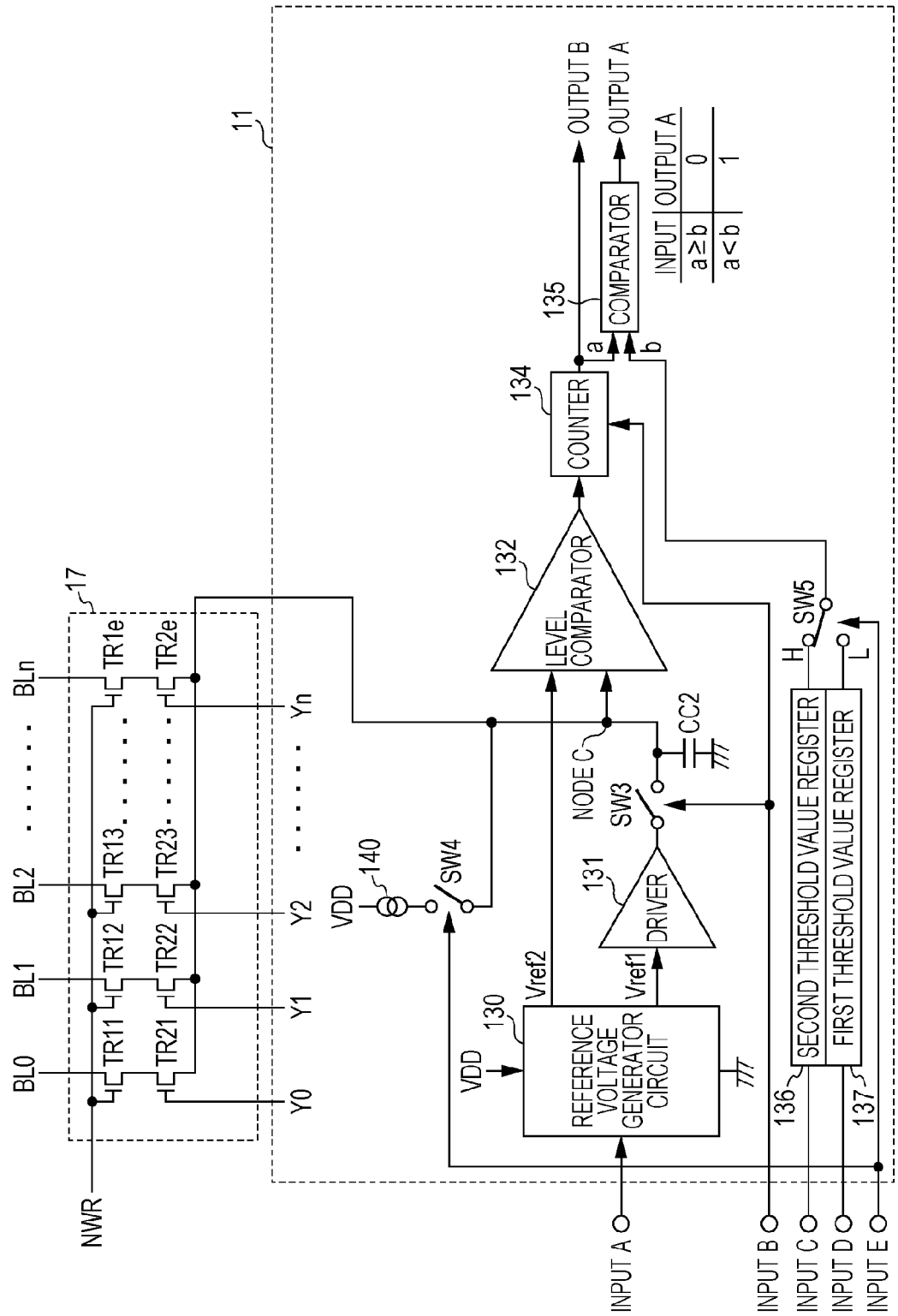
FIG. 9 is a block diagram illustrating an example of a schematic configuration of a read circuit according to the exemplary embodiment.

FIG. 9 is a block diagram illustrating an example of a schematic configuration of the read circuit which the data generating device according to the exemplary embodiment has. The column decoder circuit 17 surrounded by a dotted line in FIG. 9 is the same as described above, so description thereof will be omitted.

A reference voltage generator circuit 130 in FIG. 9 outputs a predetermined reference potential based on an input A from the control circuit 15. The reference voltage generator circuit 130 includes ladder resistors and a semiconductor switch, for example. Voltage equivalent to the potential difference between a power source voltage VDD and a ground voltage GND is divided by the ladder resistors at the reference voltage generator circuit 130, and accordingly multiple predetermined potentials are generated. Further, the semiconductor switch and so forth within the reference voltage generator circuit 130 select one of the multiple potentials, and outputs this as a reference potential. The reference voltage generator circuit 130 may selectively output a first reference potential Vref1 and a second reference potential Vref2, for example.

The first reference potential Vref1 and second reference potential Vref2 satisfy the relationship of Vref1>Vref2. A different configuration may be used for the circuit to generate the reference potential, instead. The second reference potential Vref2 may differ between the first read mode and the second read mode.

A switch SW3 is switched in accordance with input B from the control circuit 15. In other words, the input B is a switch control signal. The switch SW3 goes OFF when a low-level signal is input, and goes ON when a high-level signal is input. When the switch SW3 goes OFF, the input state from the reference voltage generator circuit 130 to a node C switches to a high impedance (HiZ) state. When the switch SW3 goes ON, the first reference potential Vref1 is output to the node C via a driver 131.

Note that in practice, the input and output voltage values may change slightly, depending on voltage drop at the transistors and wiring, which are included in the driver 131 or other circuits. However, the effects of voltage drop and so forth will be described as being negligible below, to facilitate description.

The node C is connected to a selected memory cell within the memory cell array 20. For example, assumption will be made regarding a case of reading resistance value information from the memory cell at the upper left corner in FIG. 8. First, all bit lines and word lines are set to 0 V. The control circuit 15 in FIG. 9 sets a line NWR to high level, a line Y0 to high level, and lines Y1 through Yn to low level. This selects the bit line BL0. Further, the row decoder circuit 18 sets the selected word line WL0 to high level, and unselected word lines excluding WL0 to low level. Further, the first reference potential Vref1 is applied to the node C connected to the selected bit line BL0. The first reference potential Vref1 is equivalent to the read voltage.

A capacitor CC2 is connected between the node C and the ground, with the capacitor CC2 being connected in parallel with the selected memory cell. The capacitor CC2 may be line capacitance, and/or diffusion capacitance of a transistor, or may be an independent capacitance element.

The capacitance of the capacitor CC2 may be small, to increase the read speed. The switch control signal (input B) input to the switch SW3 goes to high level, and accordingly the potential of the node C goes to first reference potential Vref1. Thereafter, the switch control signal goes to low level, and the input state from the reference voltage generator circuit 130 to the node C goes to the high impedance (HiZ) state. This causes the capacitor CC2 to start discharging, due to which the potential of the node C gradually drops from the first reference potential Vref1. The time constant of this drop is determined by the capacitance of the capacitor CC2 and the resistance value of the memory cell regarding which the capacitor CC2 is connected in parallel.

That is to say, when the resistance value of the selected memory cell is low, the current flowing through node C is larger, and the decrease of potential at the node C is faster. On the other hand, when the resistance value of the selected memory cell is high, the current flowing through node C is smaller, and the decrease of potential at the node C is slower.

Figure 10:
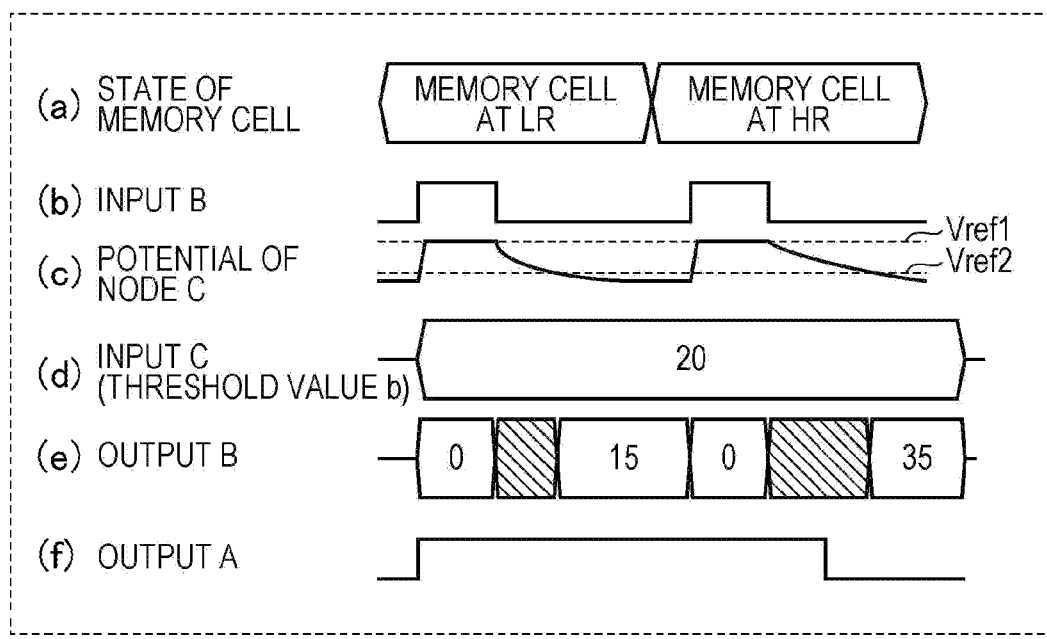
FIG. 10 is a timing chart illustrating an operation example of primary portions of the read circuit according to the exemplary embodiment.

FIG. 10 is a timing chart illustrating an operation example of primary portions of the read circuit illustrated in FIG. 9. Part (a) of FIG. 10 illustrates the state of a memory cell, in a case where the selected memory cell is in a low resistance state LR for the first half, and where the selected memory cell is in a high resistance state HR for the second half. Input B changes to high level at a timing illustrated in part (b) of FIG. 10, corresponding to each of the low resistance state LR and high resistance state HR. During periods where the input B is high level, the first reference potential Vref1 is applied to the node C, as illustrated in part (c) of FIG. 10.

When the input B switches from high level to low level, the switch SW3 goes OFF, and the input state from the reference voltage generator circuit 130 to the node C goes to HiZ. Accordingly, the potential of the node C gradually drops. The time that it takes for the potential of the node C to fall below the second reference potential Vref2 is short when the selected memory cell is in the low resistance state LR, and long when in the high resistance state HR. A count value corresponding to this time is used as the resistance information in the present embodiment.

A level comparator 132 illustrated in FIG. 9 compares the second reference potential Vref2 output by the reference voltage generator circuit 130 with the potential of the node C. In a case where the potential of the node C is larger than the second reference potential Vref2, the level comparator 132 outputs a low level signal, and if smaller, outputs a high level signal. That is to say, the period after the switch control signal switches from the high level to low level until the output signal of the level comparator 132 changes from low level to high level is short in a case where the selected memory cell is in the low resistance state LR, and long in a case of in the high resistance state HR.

A counter 134 is at 0 while the input B is at high level. When the input B is at low level, and also the input from the level comparator 132 is at low level, the counter 134 counts up following the cycle of an input clock. An upper limit value for the count value may be set at the counter 134 so that there is no overflow of the count value.

The operations of the counter 134 are illustrated in part (e) of FIG. 10. Immediately after the input B changes to low level, the counter 134 starts counting up, as illustrated in part (e) of FIG. 10. Thereafter, the count-up stops at the timing where the potential of the node C falls below the second reference potential Vref2. In a case where the selected memory cell is at the low resistance state LR, the count value when the count-up stops is "15", for example. In a case where the selected memory cell is at the high resistance state HR, the count value when the count-up stops is "35", for example.

The input C in FIG. 9 is a threshold value corresponding to the second read mode for example. The input C is set in a second threshold value register 136. The input D is a threshold value corresponding to the first read mode, for example, and is set in a first threshold value register 137.

Input E is a switching signal to switch between the first read mode and the second read mode, for example. The input E switches a switch SW5. When the switching signal is high level, the switch SW5 is connected to a terminal H illustrated in FIG. 9. When the switching signal is low level, the switch SW5 is connected to a terminal L illustrated in FIG. 9.

Due to this switching, a threshold value held in either the second threshold value register 136 or the first threshold value register 137 is input to a comparator 135 for data readout as input b. The threshold value in the second read mode is a value to distinguish a count value corresponding to the high resistance state HR and a count value corresponding to the low resistance state LR, for example. This threshold value is "20" in the example illustrated in part (d) of FIG. 10.

The comparator 135 receives input of the count value output form the counter 134 as an input a. The comparator 135 compares the count value (i.e., input a) and threshold value (i.e., input b). In a case where the value of the input a is larger than the value of the input b, the comparator 135 determines that the selected memory cell is at the high resistance state HR, and outputs information "0" for the output A. In a case where the value of the input a is smaller than the value of the input b, the comparator 135 determines that the selected memory cell is at the low resistance state LR, and outputs information "1" for the output A. the output A is latched by a data register (omitted from illustration) within the data generating device 10, for example.

As described above, the read circuit 11 reads out the resistance value information of a selected memory cell by using difference in attenuation time of the voltage at the node C in accordance with the resistance value of the selected memory cell. As a result, the read circuit 11 can output binary digital logic value corresponding to the resistance state of the memory cell as output A.

In the third read mode, the read circuit 11 does not execute determination using the threshold value, but rather outputs the count value of the counter 134 as it is to the data generator circuit 25, as output B. The count value is output by clock cycle resolution, for example. The count value is input to a count value register 30 of the data generator circuit 25.

The count value is a value which has correlation with the resistance value of the memory cell. While the count value is a numerical value representing the discharge time of voltage at both ends of the memory cell as far as being a physical amount, the count value also is information representing the resistance value of the memory cell.

Note that the value of the input C and the hold value of the counter 134 are not restricted to the values exemplarily illustrated in parts (d) and (e) of FIG. 10. These values may change in accordance with the count clock frequency of the counter 134, the capacitance of the capacitor CC2, the set values of the first reference potential Vref1 and second reference potential Vref2, the current amount of a constant current source 140, the state of a switch SW4, variance in resistance values of memory cells, and so forth.

Next, an example of a method to change the measurement range of the read resistance values will be described. This enables the measurement range of resistance values read out to be switched among the first read mode, second read mode, and third read mode, for example.

In the read circuit 11 illustrated in FIG. 9, the constant current source 140 is connected to the node C via the switch SW4. The constant current source 140 may include a p-channel metal-oxide semiconductor field-effect transistor (MOSFET), or may include a circuit serving as a current mirror.

The switch SW4 goes to ON when input E from the control circuit 15 is high level, and goes ON when low level. When the switch SW4 is ON, constant current is supplied to the node C. In this case, the discharge time from the capacitor CC2 is long.

Figure 11:
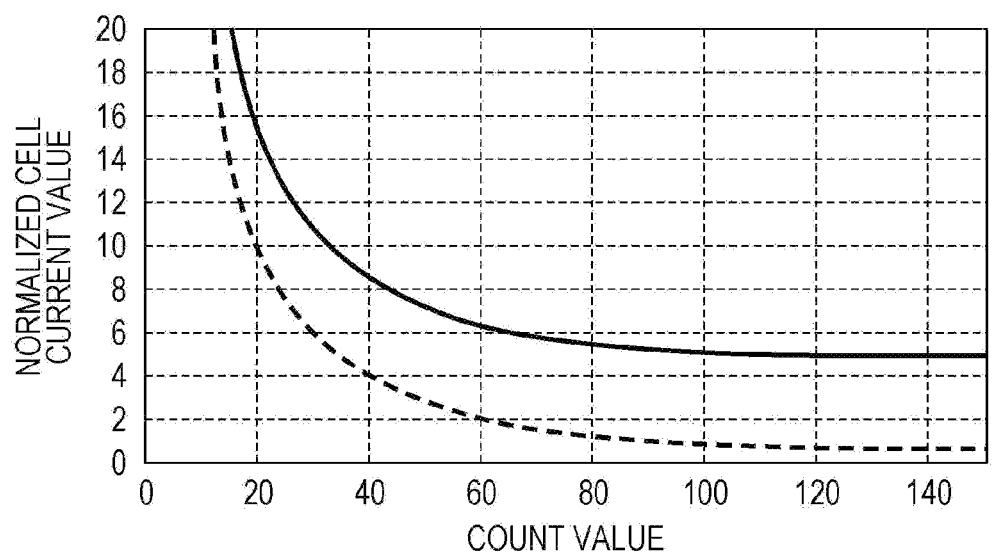
FIG. 11 is a graph illustrating an example of temporal change of a current flowing through a node, in the read circuit according to the exemplary embodiment.

FIG. 11 illustrates change in the current values flowing through the node C between a case where the switch SW4 is ON and a case where the switch SW4 is OFF, in the read circuit 11 illustrated in FIG. 9. The horizontal axis in FIG. 11 represents the count value of the counter 134, and the vertical axis represents the normalized cell current value. The normalized cell current value is obtained by normalizing DC current flowing through a selected memory cell when a predetermined voltage is applied thereto. The normalized cell current value is equivalent to the inverse of the resistance value of the memory cell. That is to say, FIG. 11 represents the correlation between the count value of the memory cell read out by the read circuit 11, and the amount of the current actually flowing through this memory cell.

The count value and cell current almost satisfy a relationship where cell current=$C1 \times T^{C2}$, where T is the product of count value and clock cycle, and C1 and C2 are constants. The dotted line in FIG. 11 illustrates the change of the cell current over time in a case where the switch SW4 is OFF, and the solid line in illustrates the change of the cell current over time in a case where the switch SW4 is ON.

In a case where the switch SW4 is OFF, the cell current value changes from around "10" to "1" as the count value changes from "20" to "100", as illustrated in FIG. 11. In a case where the switch SW4 is ON, the cell current value changes from around "15" to "5" as the count value changes from "20" to "100".

That is to say, the measurement range of count values is switched by the switch SW4 illustrated in FIG. 9. More specifically, when the switch SW4 is ON, the measurement range of the read circuit 11 may be set to a range suitable for measuring threshold value information equivalent to a relatively low resistance value. Accordingly, the read circuit 11 may determine which of the first resistance value range and the second resistance value range the resistance value of a selected memory cell is in, in a precise manner, for example. This corresponds to the second read mode.

When the switch SW4 is OFF, the measurement range of the read circuit 11 may be set to a range suitable for measuring threshold value information equivalent to a relatively high resistance value. Accordingly, the read circuit 11 may determine which of the initial resistance value range and the first resistance value range the resistance value of a selected memory cell is in, in a precise manner, for example. This corresponds to the first read mode.

Note that the read resolution is not restricted to being adjusted by ON/OFF of the switch SW4 alone, and may be adjusted by the current amount of the constant current source 140, the frequency of the clock input to the counter 134, the magnitude of the first reference potential Vref1 and second reference potential Vref2, capacitance of the capacitor CC2, and so forth. When the clock frequency is higher, for example, the read resolution is higher.

The read measurement range may be set so that a relatively high resistance value is read out in a short time. This setting may be realized by, for example, setting the first reference potential Vref1 and second reference potential Vref2 higher, reducing the current of the constant current source 140, reducing the capacitance of the capacitor CC2, and so forth. Conversely, the read measurement range may be set so that a relatively low resistance value is read out in a short time. This setting may be realized by, for example, setting the first reference potential Vref1 and second reference potential Vref2 lower, increasing the current of the constant current source 140, increasing the capacitance of the capacitor CC2, and so forth. Note that the resistance value measurement range in the third read mode may be the same as that in the first read mode and second read mode, or may be different from that in the first read mode and second read mode.

Now, in a case where the first reference potential Vref1 is excessively large, there is the concern that the resistance state of the selected memory cell may be changed by this potential. Accordingly, the first reference potential Vref1 may be set within a predetermined value so that the resistance state of the memory cell does not change.

[Data Generator Circuit]

Figure 12:
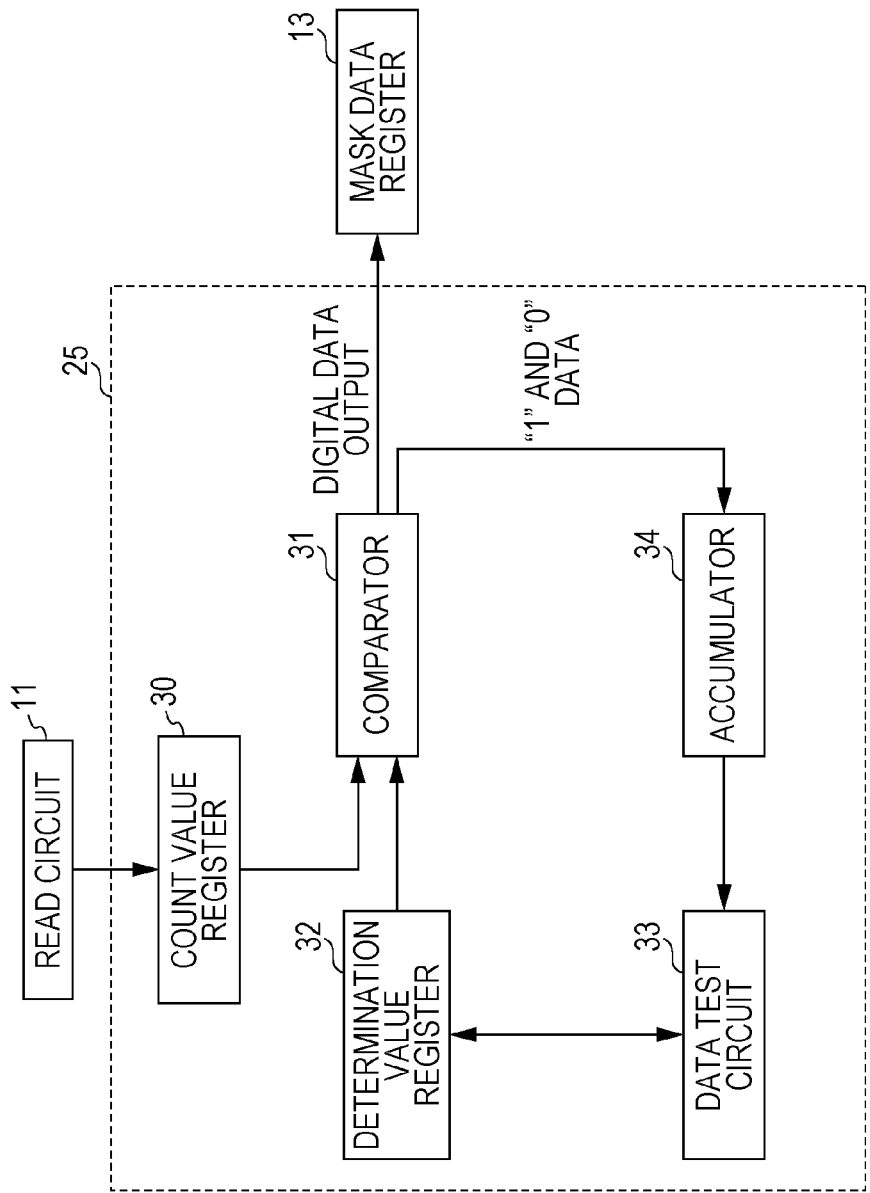
FIG. 12 is a block diagram illustrating an example a schematic configuration of a data generating circuit according to the exemplary embodiment.

FIG. 12 is a block diagram illustrating an example of a schematic configuration of the data generator circuit which the data generating device according to the exemplary embodiment has. The data generator circuit 25 acquires multiple count values from the read circuit, generates data by allocating the multiple count values to the two values of "0" and "1" based on determination values, and outputs the data to the mask data register 13. The determination values may be set by the data generator circuit 25, or may be externally input. The determination values are set using count values acquired from multiple memory cells. Note that the count value is an example of "resistance value information".

The mask data register 13 temporarily stores digital data acquired from the data generator circuit 25. Mask data includes address information, in order to record data generated by the data generator circuit 25 in the memory cell array 20, for example. This address may be an address of a memory cell to be changed to a variable state. Mask data may be used in a case of rewriting data in the memory cell array 20 that has been written once. In a case where data generated by the data generator circuit 25 is not to be written to the memory cell array 20, the data generating device 10 may not include the mask data register 13.

The data generator circuit 25 illustrated in FIG. 12 includes the count value register 30, a comparator 31, a determination value register 32, an accumulator 34, and a data test circuit 33.

The determination value register 32 temporarily stores an initial value of the determination value, a determination value output from the data test circuit 33, or a determination value within the data generator circuit 25 or externally input. For example, the data generator circuit 25 may further have a determination value setting unit which sets determination values based on the count value register 30.

The comparator 31 compares the count values held by the count value register 30 and the determination value sored in the determination value register 32, and selects one or the other of "0" and "1". This generates digital data. The digital data is output to the accumulator 34 and mask data register 13.

The accumulator 34 stores at least one of the number of "1"s and the number of "0"s output from the comparator 31, and the difference in number of the two. For example, in a case where the determination value is to be set in increments of blocks with a fixed length, recording one of the "1"s and "0"s effectively records the number of both.

The data test circuit 33 tests whether the difference in the number of "1"s and the number of "0"s is within a predetermined range. Depending on the results thereof, the data test circuit 33 changes the determination value stored in the determination value register 32, and causes the comparator 31 to select "1"s and "0"s again. The data test circuit 33 may repeat the selection processing until the difference in the number of "1"s and the number of "0"s comes to be within a predetermined range.

The data test circuit 33 may be omitted. In this case, the determination value may be input to the determination value register 32 from outside of the data generator circuit 25.

Figure 13:
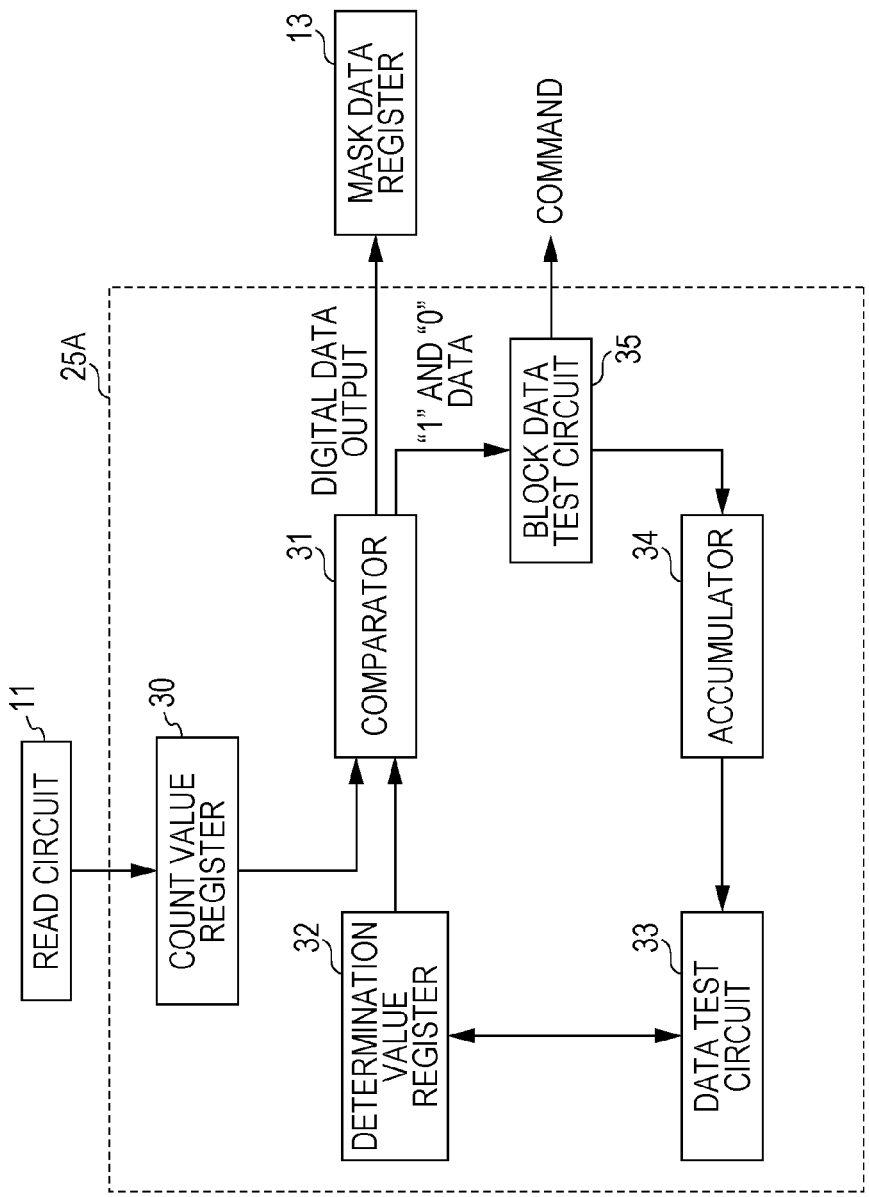
FIG. 13 is a block diagram illustrating an example a schematic configuration of a data generating circuit according to the exemplary embodiment.

Alternatively, the data generator circuit 25 may include a block data test circuit 35, as illustrated in FIG. 13. The block data test circuit 35 determines whether or not the number of "1"s included in block data is equal to or more than a predetermined test value, for example. In a case where the determination is non-passable, the block data test circuit 35 may output a command to the write circuit 14, to apply electric stress to multiple memory cells 21 included in this block. Further, the block data test circuit 35 may output a command to the read circuit 11 to re-acquire the count values of the multiple memory cells 21 included in this block. These commands cause count values to be acquired again, and the data generator circuit 25 may execute data generating again based thereupon. The block data test circuit 35 may be made to repeat this processing until the generated data passes the test.

The block data test circuit 35 may determine whether or not the multiple counter values output from the count value register 30 satisfy a predetermined test condition, for example. In a case where the determination is non-passible, the block data test circuit 35 may output a command to the write circuit 14, to apply electric stress to multiple memory cells 21 included in this block. Further, the block data test circuit 35 may output a command to the read circuit 11 to re-acquire the count values of the multiple memory cells 21 included in this block. The block data test circuit 35 may further test the newly-acquired count values. Thus, multiple count values which have passed the test are input to the comparator 31.

[Example of Data Generating Operations]

Figure 14:
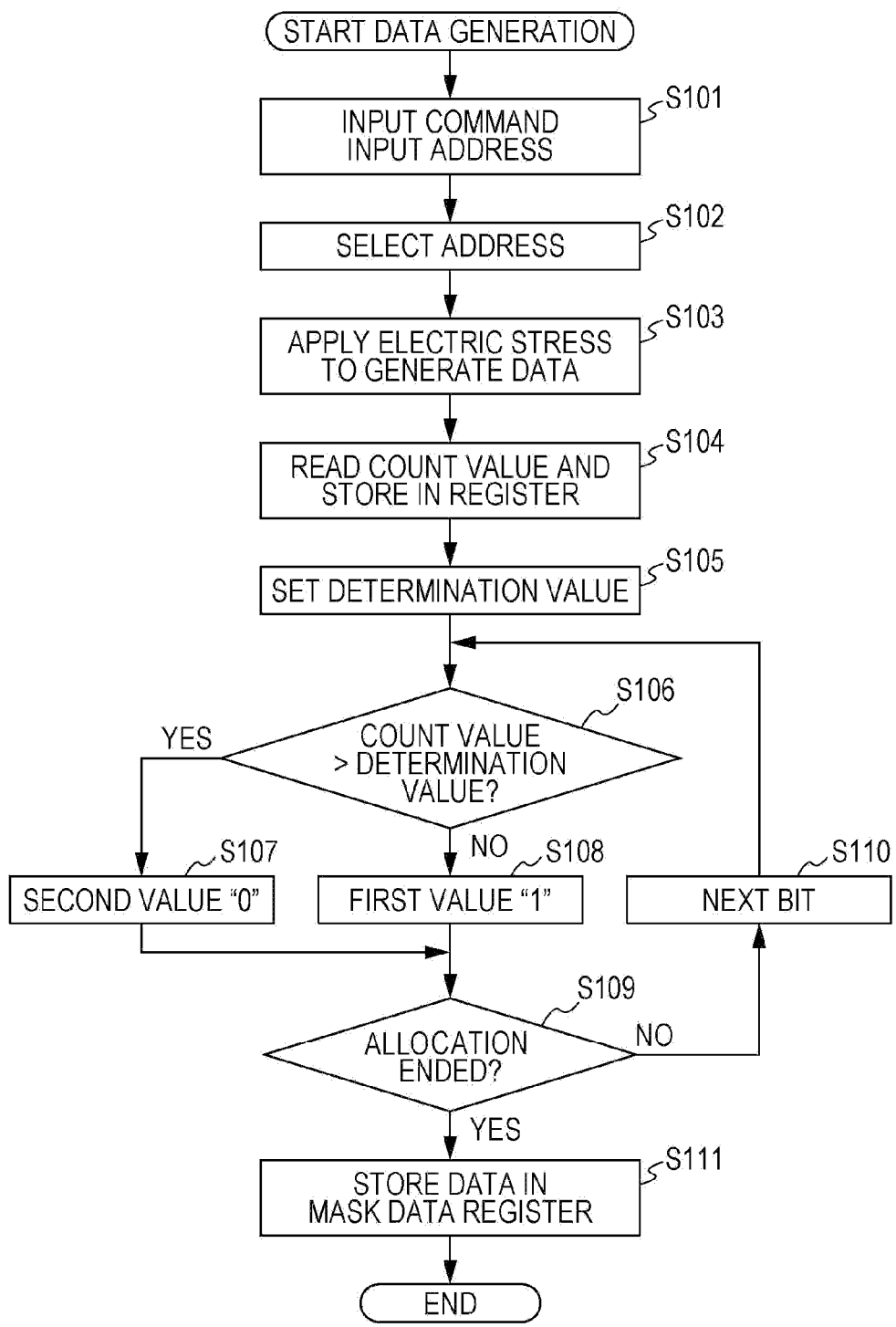
FIG. 14 is a flowchart illustrating an operation example of intrinsic data generation in a data generating device according to the exemplary embodiment.

FIG. 14 is a flowchart illustrating an operation example of data generation by the data generating device 10 according to the exemplary embodiment. It should be noted that data generation methods according to the embodiment are not restricted to those of the operation example described here.

The following is a description of an example where random data is generate using dispersion in resistance values among multiple memory cells. The dispersion in resistance values among multiple memory cells in the present operation example is generated by data generation electric stress being applied to multiple memory cells. The generated random data is digital data that consists of "1"s and "0"s.

A detailed flow will now be described with reference to FIG. 14. In step S101, a command instructing application of electric stress, and an address to which the electric stress is to be applied, are input from outside of the data generating device 100.

In step S102, the first address of multiple addresses to which electric stress is to be applied is selected.

In step S103, the write circuit 14 applies data generation electric stress to a memory cell in the initial state. The data generation electric stress is positive-polarity pulse voltage, for example. The data generation electric stress is weaker than electric stress which competes forming. This electric stress application causes the resistance values of the memory cells to randomly change to lower resistance values than immediately after having been manufactured, within the initial resistance value range. As a result, the resistance values of the memory cells randomly vary.

In step S104, the read circuit 11 is first set to the third read mode. For example, the switch SW4 in FIG. 9 turns OFF, and the read measurement range is set to the high resistance side. In a case where the upper limit of the count value of the read circuit 11 is "255", the read circuit 11 outputs count values in the range of "1" to "255", in accordance with the resistance values of the memory cells, and these are stored in the count value register 30.

In step S105, a determination value is set in the data generator circuit 25. A fixed value may be set for the determination value, or a determination value may be set based on the count value stored in the register in step S104.

For example, in a case where the median value of the count values of the memory cells is "150", the determination value may be set to "150". Setting the median value as the determination value results in "1"s and "0"s being selected almost evenly. This improves the random nature of the generated data. The determination value may be a value obtained by adding a predetermined offset value to the median value. The offset value may have been obtained by research using a known randomness evaluation tool such as NIST 800-22 beforehand. A method for calculating a media value from the count values of the memory cells, and using this median value as the determination value, will be described later.

For example, the data generating device 10 may include a computing circuit or software which computes a determination value and/or evaluates randomness of the generated data. A manufacturing device of a non-volatile storage device may include the computing circuit or software, instead. In this case, part of the data generating device 10 as illustrated in FIG. 8 is located in the manufacturing device, and remaining part thereof is located in the non-volatile storage device, for example.

In this case, the computing circuit may generate various determination values by increasing/decreasing a numerical value of a determination value which is generated based on a set of count values. Next, the data generating device 10 may generate multiple data pieces based on the set of count values and the various determination values. Next, the computing circuit may evaluate randomness of the multiple data pieces, and select, from the multiple data pieces, a data piece having the best randomness. In other words, the data generating device 10 may select, of the candidate determination values, a determination value to be set which corresponds to the data piece having the best randomness.

In step S106, the data generator circuit 25 compares the count values of the memory cells stored in the count value register 30 with the determination value. In a case where a count value is larger than the determination value, the second value "0" is selected (step S107). In a case where a count value is equal to or smaller than the determination value, the first value "1" is selected (step S108).

The processing of steps S106 through S108 is repeated until all count values are allocated (steps S109 and S110).

After the above-described processing regarding all count values has ended, the generated data is stored in the mask data register 13 in step S111. Accordingly, the data generating operation ends (End).

The present inventors generated 1 kb of data based on the above flow. Note that the median value of the multiple count values read out was used as the determination value. The configuration of the memory cells was the same as in FIG. 1. The results are given as the Test Example 1 in FIG. 19. A known tool (NIST SP800-22) was used for testing randomness. The generated data passed the monobit test. A monobit test is a test regarding whether or not deviation from a state where the number of "0"s and "1"s in the data is uniform, is within a predetermined range. Further, this data also passed other test items. These results indicate that the generated data had a high level of randomness.

[Example of Determination Value Setting Operations]

Figure 15:
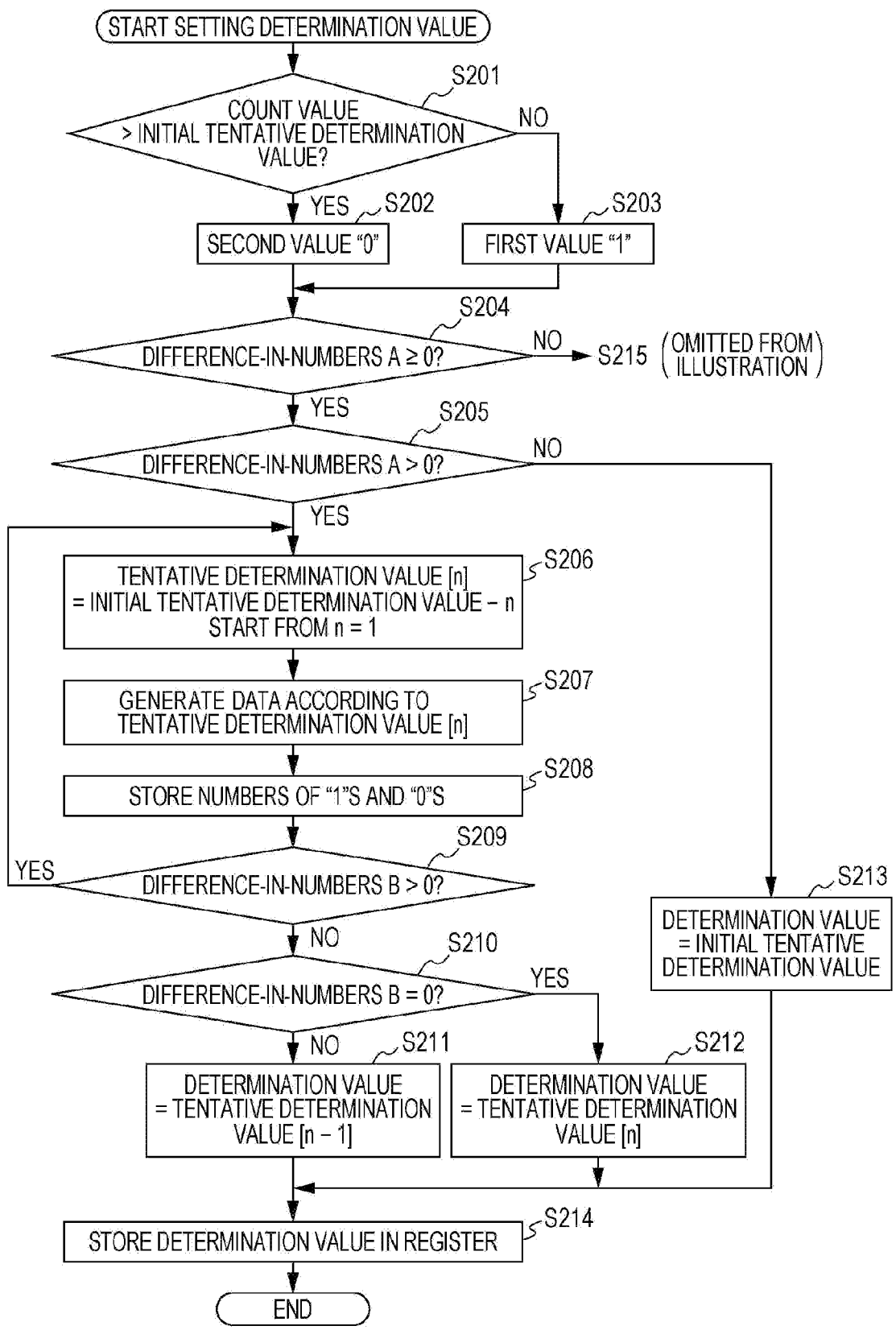
FIG. 15 is a flowchart illustrating an operation example of setting a determination value in the data generating device according to the exemplary embodiment.

FIG. 15 is a flowchart illustrating an example of operations to set determination values at the data generating device 10 according to the exemplary embodiment. This flowchart illustrates a specific example of step S105 in FIG. 14. An example of calculating a median value from multiple count values, and setting the median value as the determination value, will be described with reference to FIGS. 15 and 12.

In step S201, the count values are compared with a predetermined initial tentative determination value. The multiple count values are stored in the count value register 30. The value of the initial tentative determination value is an optional value, input to the determination value register 32. In a case where a count value is larger than the initial tentative determination value, the second value "0" is selected (step S202), and in a case where the count value is equal to or smaller than the initial tentative determination value, the first value "1" is selected (step S203). For example, in a case where the initial tentative determination value is "150", count values larger than "150" are distributed to the second value "0", and count values equal to or smaller than "150" are distributed to the first value "1".

In steps S204 and S205, determination is made regarding whether or not the difference in the number of "1"s and the number of "0"s is within a predetermined range. For example, the accumulator 34 stores the number of "1"s and the number of "0"s output from the comparator 31, and the data test circuit 33 obtains the difference in the number of "1"s and the number of "0"s. This difference-in-numbers A is expressed as follows.

(Difference-in-numbers $A$)=(number of "1"s)−(number of "0"s)

Depending on the value of the difference-in-numbers A, the flow after S204 branches as follows.

In a case where difference-in-numbers A is equal to 0, the initial tentative determination value is the median value of the multiple count values that have been acquired. In this case, the data test circuit 33 decides the initial tentative determination value to be the determination value in step S213. For example, in a case where the initial tentative determination value was "150", the determination value is "150".

In a case where the difference-in-numbers A is larger than 0, the flow advances to step S206. In a case where the difference-in-numbers A is smaller than 0, the flow advances to step S215. First, description will be made regarding the case where the difference-in-numbers A is larger than 0.

In step S206, the data test circuit 33 stores a value obtained by subtracting 1 from the initial tentative determination value in the determination value register 32 as a new tentative determination value. For example, in a case where the initial tentative determination value was "150", the new tentative determination value is "149".

Each count value is compared with the new tentative determination value in step S207, and either "1" or "0" is selected according to the comparison result. Step S207 is the same as steps S201 through S203 except for the point that the new tentative determination value is being used instead of the initial tentative determination value.

In step S208, the accumulator 34 stores the number of "1"s and the number of "0"s output from the comparator 31.

In step S209 and S210, determination is made regarding whether or not the difference in the number of "1"s and the number of "0"s is within a predetermined range. For example, the data test circuit 33 obtains the difference in the number of "1"s and the number of "0"s. This difference-in-numbers B is expressed as follows.

(Difference-in-numbers $B$)=(number of "1"s)−(number of "0"s)

Depending on the value of the difference-in-numbers B, the flow after S209 branches as follows.

In a case where the difference-in-numbers B is larger than 0 in step S209, the flow returns to step S206. In the second time at step S206, the data test circuit 33 stores a value obtained by further subtracting 1 from the current tentative determination value in the determination value register 32 as a new tentative determination value. For example, in a case where the initial tentative determination value was "149" in step S206 the first time, the new tentative determination value is "148" in step S206 the second time. Thereafter, the steps S207 through S209 are performed the second time, based on the new tentative determination value "148".

The steps S206 through S209 are repeatedly executed while updating the new tentative determination value by subtracting 1 from the previous tentative determination value, until the difference-in-numbers B becomes 0 or smaller. The tentative determination value after the flow of steps S206 through S209 has been performed n times is defined as follows.

(Tentative determination value [$n$])=(initial tentative determination value)−$n$ The following is a description regarding a case where the difference-in-numbers B reaches 0 or less for the first time in the n'th step S209. In this case, the flow advances to step S210.

In a case where the difference-in-numbers B is 0, the current tentative determination value [n] is the median value of the multiple count values that have been acquired. In this case, the data test circuit 33 decides the current tentative determination value [n] to be the determination value in step S212.

In a case where the difference-in-numbers B is smaller than 0, in step S211 the data test circuit 33 decides the previous tentative determination value [n−1] to be the determination value. The previous tentative determination value [n−1] is equivalent to the tentative determination value immediately before the sign of the difference-in-numbers B changes from plus to minus. Thus, the numbers of "0"s and "1"s are approximately uniform.

Alternatively, in a case where the difference-in-numbers B is smaller than 0, the data test circuit 33 may decide the current tentative determination value [n] to be the determination value. The current tentative determination value [n] is equivalent to the tentative determination value immediately after the sign of the difference-in-numbers B changes from plus to minus. In this case as well, the numbers of "0"s and "1"s are approximately uniform.

Assuming a case where the initial tentative determination value is "150", for example, and step S206 was performed three times (n=3) to set the tentative determination value, we will consider a case where the difference-in-numbers B is +9 when the second initial tentative determination value is "148" and the difference-in-numbers B at the third time is −3 when the third initial tentative determination value is "147". In this case, the determination value is decoded to be either one of "148" and "147".

Upon the determination value being decided in steps S211, S212, or S213, this determination value is stored in the determination value register 32 in step S214. Note that in a case where a tentative determination value that is the same value as the determination value is already stored in the determination value register 32, step S214 may be omitted.

Next, a flow in step S204 in a case where the difference-in-numbers A is smaller than 0 will be described as steps S215 through S221. Note that steps S215 through S221 have been omitted from illustration from FIG. 15, as they are similar to steps S206 through S212.

In step S215, a value obtained by adding 1 to the initial tentative determination value is set as a new tentative determination value and stored in the determination value register 32. For example, in a case where the initial tentative determination value was "150", the new tentative determination value is "151".

Each count value is compared with the new tentative determination value in step S216, and either "1" or "0" is selected according to the comparison result. Step S216 is the same as steps S201 through S203 except for the point that the new tentative determination value is being used instead of the initial tentative determination value. Thereafter, the accumulator 34 stores the number of "1"s and the number of "0"s output from the comparator 31 in step S217.

Determination is made in step S218 regarding whether or not the difference in the number of "1"s and the number of "0"s is within a predetermined range. For example, the data test circuit 33 obtains the difference in the number of "1"s and the number of "0"s. This difference-in-numbers C is expressed as follows.

(Difference-in-numbers C)=(number of "1"s)−(number of "0"s)

In a case where the difference-in-numbers C is larger than 0 in step S218, the flow returns to step S215. In the second time at step S215, the data test circuit 33 stores a value obtained by further adding 1 to the current tentative determination value in the determination value register 32 as a new tentative determination value. For example, in a case where the initial tentative determination value set in step S215 the first time was "151", then "152" is set as the new tentative determination value in step S215 the second time. Thereafter, the steps S216 through S218 are performed the second time, based on the new tentative determination value "152".

The steps S215 through S218 are repeatedly executed while updating the new tentative determination value by adding 1 to the previous tentative determination value, until the difference-in-numbers C becomes 0 or larger. The tentative determination value after the flow of steps S215 through S218 has been performed n times is defined as follows.

(Tentative determination value [n])=(initial tentative determination value)+n

The following is a description regarding a case where the difference-in-numbers C reaches 0 or more for the first time in the n'th step S218. In this case, the flow advances to step S219.

In a case where the difference-in-numbers C is 0, the current tentative determination value [n] is the median value of the multiple count values that have been acquired. In this case, the data test circuit 33 decides the current tentative determination value [n] to be the determination value in step S221.

In a case where C is larger than 0, in step S220 the data test circuit 33 decides the previous tentative determination value [n−1] or the current determination value [n] to be the determination value. Thus, the numbers of "0"s and "1"s are approximately uniform. The decided determination value is stored in the determination value register 32 (step S214).

As a result of the above, the number of "1"s and the number of "0"s can be approximately equal. Even if these cannot be strictly divided into half due to the resolution of the read circuit 11, using the above-described flow enables dividing almost evenly. Consequently, the randomness of the generated data improves.

In a case where the flow illustrated in FIG. 15 is to be executed in step S105 where the determination value is set in FIG. 14, steps S106 through S110 in FIG. 14 may be omitted. In this case, data which has been assigned "0" or "1" in steps S201 through S203, step S207, or step S216 in FIG. 15 may be stored in the mask data register 13 in step S111 in FIG. 14. In other words, steps S106 through S110 in FIG. 14 may be any one of steps S201 through S203, step S207, or step S216 in FIG. 15.

The determination value may be set outside of the data generator circuit 25. For example, in a case where the data generating device 10 includes a non-volatile storage device, the manufacturing device which manufactures this non-volatile storage device may execute the flow illustrated in FIG. 15. In this case, the count value is output to the manufacturing device, the manufacturing device decides the determination value, and the determination value is stored in the determination value register 32 within the data generator circuit 25. This can suppress increase in circuit scale of the non-volatile storage device.

The flow illustrated in FIG. 15 shows an example of taking the median value of multiple count values as the determination value, but the determination value may be a value other than the median value. For example, the determination value may be any value within a range where the randomness of the generated data is not compromised. The data generating device 10 may include a computing circuit for randomness evaluation, for example. In this case, the computing circuit may evaluate the randomness of the data generated based on the tentative determination values of the computing circuit, and the tentative determination value of the data of which the randomness is the highest may be decided to be the determination value.

In a case where the data generating device 10 includes a non-volatile storage device, the manufacturing device which manufactures this non-volatile storage device may include a computing circuit for randomness evaluation, for example.

[Example of Block Data Generating Operations for Each Block]

The present inventors have found a method to generate data by sectioning the memory cell array into predetermined blocks, and allocating, for each block, resistance value information pieces to "0"s and "1"s. This enables highly random data to be generated even if the size of the data to be generated is great, for example.

Text Example 2 in FIG. 19 exemplarily illustrates test results regarding randomness of 256 kb data generated by the method illustrated in FIG. 14. The Test Example 2 was generated under the same conditions as Test Example 1, except that the data size of the generated data was different. The results from the Test Example 2 show that there is a concern of data being generated that is non-passable in the randomness test, in a case where the data size is large.

Figure 16:
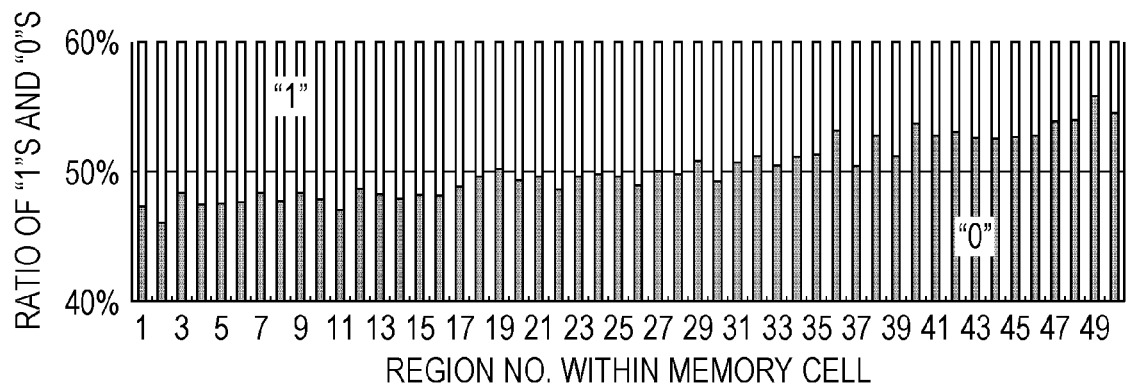
FIG. 16 is a diagram illustrating results of having examined the distribution of the number of "1"s and "0"s in each region in a memory cell array.

The present inventors reason that the cause of this is as follows. In a case where the data size is large, unevenness may occur in the resistance value distribution of memory cells in the memory cell array, and consequently, the randomness of the generated data may deteriorate. This unevenness in resistance value distribution may occur due to manufacturing factors and/or device stricture factors, for example. Specific examples thereof include variance in film thickness of the variable resistance layer, variance in manufacturing size, difference in resistance of wiring connected to the variable resistance elements, and so forth. Accordingly, the present inventors sectioned the memory cell array into multiple word lines as one region, and checked the number of "1"s and "0"s for each region. FIG. 16 illustrates the ratio of the number of "1"s and the number of "0"s in each region. It can be seen from FIG. 16 that the ratio of the number of "1"s and the number of "0"s difference greatly depending on the location in the memory cell array. Specifically, the longer the bit lines extending between the write circuit 14 and the memory cell is, in other words the farther away from the write circuit 14 a memory cell is connected to a bit line, the less readily the resistance value of that memory cell dropped. Accordingly, regions far away from the write circuit 14 exhibited a great number of "0"s.

Figure 17:
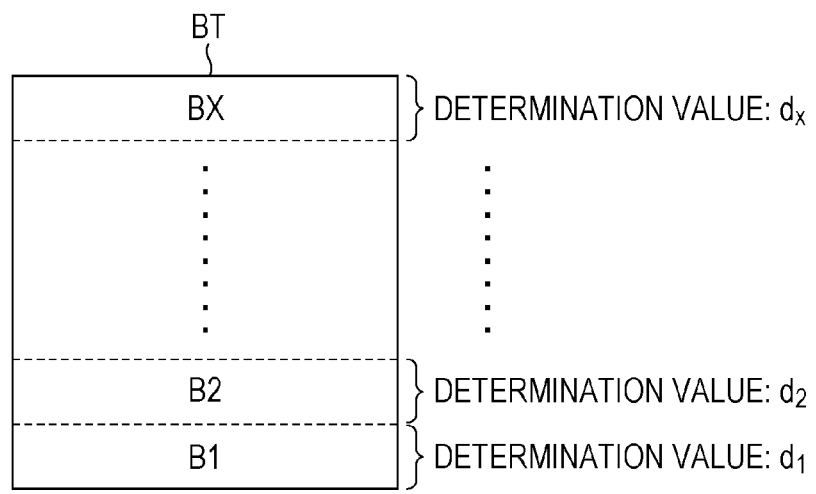
FIG. 17 is a conceptual diagram illustrating a method for differencing determination values in each block.

Accordingly, the present inventors have found a method to divide a region BT from which resistance value information is acquired for generating data into multiple blocks B1, B2, . . . BX, and set determination values d1, d2, . . . dx for each block, as illustrated in FIG. 17. Accordingly, multiple sets of block data that is highly random can be generated even when the ratio of the number of "1"s and the number of "0"s differs at different positions within a memory cell array. Using such block data enables large data which is highly random to be generated.

Accordingly, it is sufficient for the blocks to be configured from multiple memory cells, and the division method thereof is optional. Blocks may be regions adjacent with regard to physical addresses, or may be regions adjacent with regard to logical addresses. For example, multiple memory cells connected in common by at least one word line or at least bit line may be configured as one block.

Figure 18:
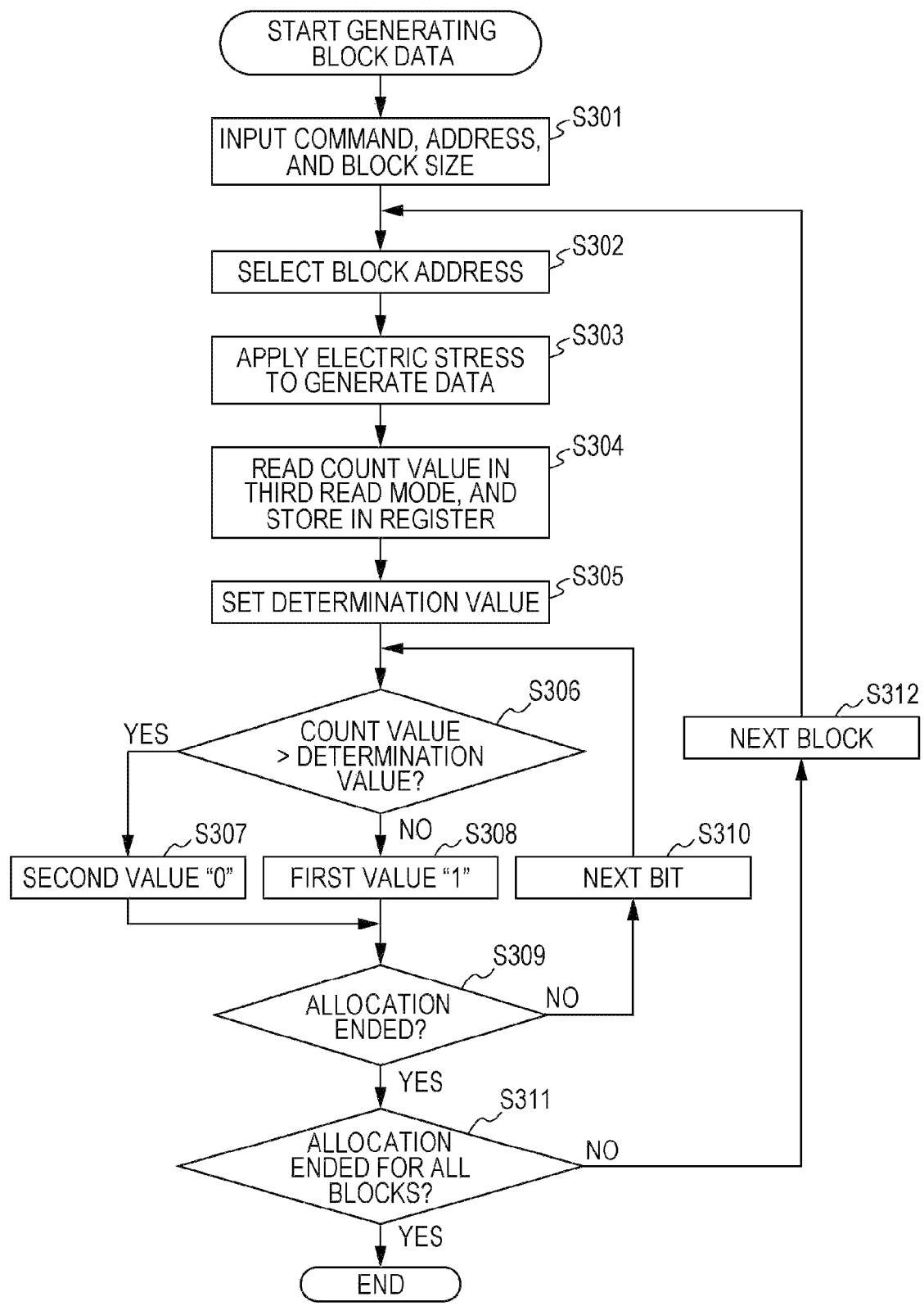
FIG. 18 is a flowchart illustrating an operation example of block data generation in the data generating device according to the exemplary embodiment.

FIG. 18 is a flowchart illustrating an operation example of data generation in the data generating device 10 according to the exemplary embodiment. Parts which are the same as in FIG. 14 may be omitted from description as appropriate.

In step S301, a command instructing application of electric stress, an address to which to apply electric stress, and the size of block data, are externally input to the data generating device 10.

In step S302, the addresses of multiple memory cells, included in the first block out of multiple blocks to which electric stress is to be applied to, are selected.

In step S303, the write circuit 14 applies data generation electric stress to all cells within the selected block.

In step S304, the read circuit 11 reads out the count values of the multiple memory cells within the block, in the third read mode, and these are stored in the count value register 30.

In step S305, the determination value is set. The determination value may be set according to the method described with reference to FIG. 15, for example.

In step S306, the data generator circuit 25 compares the count values of each of the memory cells stored in the count value register 30 with the determination value. In a case where the count value is larger than the determination value, "0" is selected (step S307). In a case where the count value is equal to or smaller than the determination value, "1" is selected (step S308). The processing of steps S306 through S308 is repeated until all count values within the block are determined (steps S309 and S310).

When generation of block data for all memory cells within one block has ended, the processing of steps S302 through S310 is performed in the same way for the next block (Steps S311 and S312). After the same processing has been performed for all blocks, generating of data ends (End). The data obtained by this method may be generated by all block data being sequentially connected, for example, or generated by some other method.

Text Example 3 in FIG. 19 exemplarily illustrates test results regarding randomness of 256 kb data generated by the method illustrated in FIG. 18. The Test Example 3 was generated as block data in increments of 4 kb blocks. As shown in FIG. 19 the data generated according to Test Example 3 passed all randomness tests, exhibiting high randomness.

The block size is not restricted to 4 kb. It should be noted, however, that if the block size is too small, the allocation in which the numbers of "1"s and "0"s are approximately uniform may be difficult depending on the resolution of the read circuit 11. In a case where the block size is too large, unevenness in resistance value distribution in the block may occur. Further, in a case where the block size is too large, the count value register 30 may become large, leading to increased scale of the circuit. From the above perspective, the block size may be appropriately selected. For example, the block size may be 1 kb or larger and 10 kb or smaller.

[Testing Block Data and Applying Electric Stress]

In a case where electric stress is applied to object memory cells before acquiring resistance value information, in order to broaden the resistance value distribution, there are cases where application of a predetermined amount of times (e.g., once) may be insufficient regarding deterioration in resistance value, or the spread in distribution of resistance values may be insufficient. Block data generated from such resistance value information may have low randomness, and accordingly may deteriorate the randomness of the entire data. To deal with this, the present inventors have found a method to improve unevenness occurring in resistance value distribution in memory cells within a block, by applying electric stress.

Figure 20:
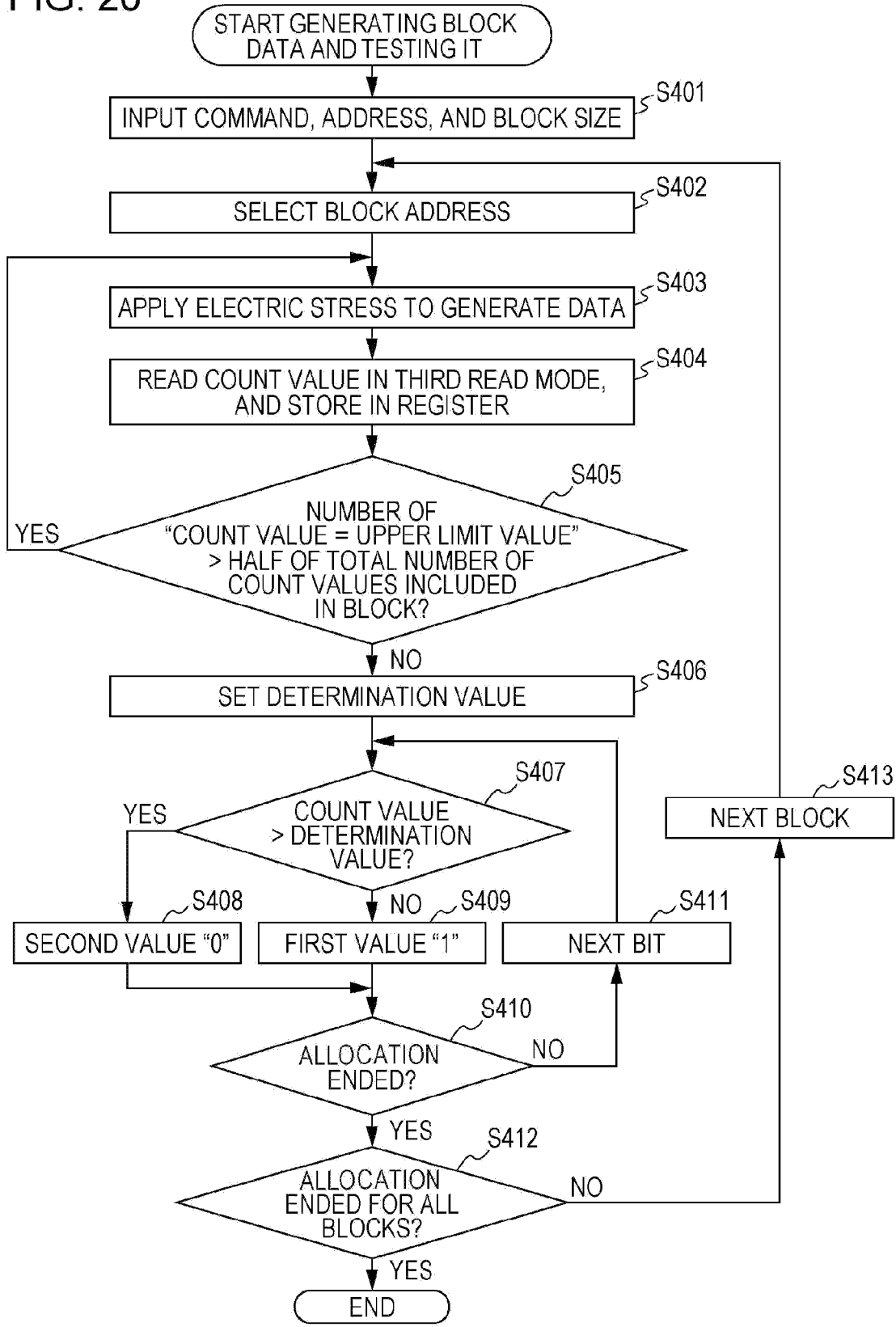
FIG. 20 is a flowchart illustrating an example of operations to test block data and re-apply electric stress.

FIG. 20 is a flowchart illustrating an example of operations performed to test block data and apply electric stress. Steps S401 through S404 in FIG. 20 are the same as steps S301 through S304 described with reference to FIG. 18, so description thereof will be omitted. Here, an example will be described where the upper limit of the count value which the read circuit 11 can output is "255".

In step S405, the number of those of which the count value is the upper limit value "255", and half of the total number of count values included in the block, are compared. In a case where the number of those of which the count value is the "255" is greater than half of the total number of count values included in the block, the flow returns to step S403, and electric stress is applied to the memory cells within the block again. Steps S403 through S405 are repeated until the number of those of which the count value "255" is half or less the total number of memory cells in the block. The electric stress reapplied in step S405 may be an electric stress equivalent to the data generation electric stress applied the first time, for example.

Step S406 and thereafter in FIG. 20 is the same as step S305 and thereafter in FIG. 18, so description thereof will be omitted.

In this operation example, if there are half or more memory cells in a part of a block where the resistance value did not drop under the same electric stress condition, applying electric stress multiple times to that block can reduce unevenness in resistance values. As a result, the number of "1"s and the number of "0"s can be almost uniform in the processing of step S406 and thereafter. Accordingly, randomness of data can be improved. Also, the processing time can be markedly reduced as compared to a method of applying data generation electric stress to all regions multiple times.

[Setting Determination Value Taking into Consideration Difference in Cumulative Number]

Depending on the resolution of the read circuit 11, there are cases where the number of "1"s is not strictly equal to the number of "0"s even if the flows illustrated in FIGS. 18 and 15 are used. Accordingly, even slight unevenness within a block may become a great unevenness overall if this occurs at a great number of blocks. Accordingly, there is the concern that the randomness of data may deteriorate in cases where the data size is extremely large. To deal with this, the present inventors have found a method to set the determination value so that the difference in the cumulative number of "1"s and the cumulative number of "0"s in the data approaches 0. Thus, the randomness of the generated data can be improved even further.

Figure 21:
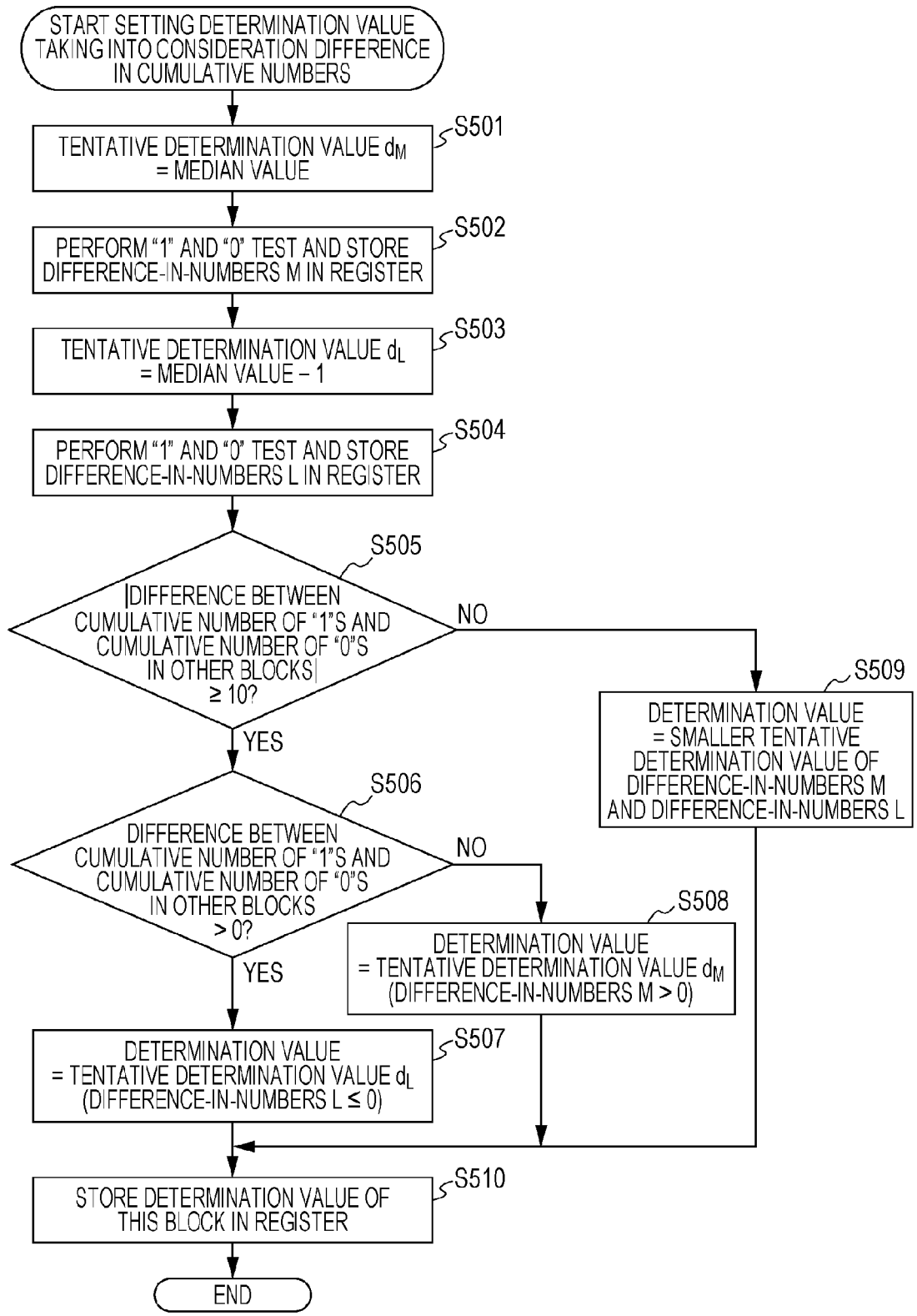
FIG. 21 is a flowchart illustrating an example of determination value setting operations.

FIG. 21 is a flowchart illustrating an example of operation to set the determination value. The operations illustrated in FIG. 21 may be executed in step S305 of FIG. 18, or step S406 of FIG. 20, for example.

FIG. 21 is an example of adjusting the determination value set for each block by taking into consideration the cumulative number of each of "1"s and "0"s. Note that in the following description "median value" means the determination value derived by the operations described with reference to FIG. 15, for example.

In step S501, the data test circuit 33 sets the median value as a tentative determination value dM. Specifically, the tentative determination value dM is temporarily stored in the determination value register 32. For example, in a case where the median value is the "148" derived in the flow illustrated in FIG. 15, "148" is set as the tentative determination value dM.

In step S502, the comparator 31 compares the tentative determination value dM with the count values, and outputs "1" if the count value is smaller than the tentative determination value dM, and outputs "0" if the count value is equal to or larger than the tentative determination value dM. Thereafter, the accumulator 34 temporarily stores a difference-in-numbers M, where the number of "0"s has been subtracted from the number of "1"s, in a register within the accumulator 34.

In step S503, the data test circuit 33 sets a value obtained by subtracting 1 from the tentative determination value dM as a tentative determination value dL. Specifically, the tentative determination value dL is temporarily stored in the determination value register 32. For example, in a case where the tentative determination value dM was "148", "147" is then set as the tentative determination value dL.

In step S504, the comparator 31 compares the tentative determination value dL and the count values, and outputs "1" if the count value is smaller than the tentative determination value dL, and outputs "0" if the count value is equal to or larger than the tentative determination value dL. Thereafter, the accumulator 34 temporarily stores a difference-in-numbers L, where the number of "0"s has been subtracted from the number of "1"s, in a register within the accumulator 34.

For example, in a case where the difference-in-numbers M determined by the tentative determination value dM is 0, the difference-in-numbers L determined by the tentative determination value dL will be a negative value. Also for example, in a case where the difference-in-numbers M determined by the tentative determination value dM is a positive value, the difference-in-numbers L determined by the tentative determination value dL will be 0 or a negative value.

In steps S505 through S509, the data test circuit 33 decides the determination value for the block which is currently the object of processing, taking into consideration the difference between the cumulative number of "1"s and the cumulative number of "0"s in one or more other blocks regarding which block data has been generated in the past. The difference between the cumulative number of "1"s and the cumulative number of "0"s is a value obtained by subtracting the cumulative number of "0"s in other blocks from the cumulative number of "1"s in the other blocks, for example. Note that the difference between the cumulative number of "1"s and the cumulative number of "0"s in other blocks is equal to an accumulation among multiple blocks of the difference in the number of "1"s and the number of "0"s in each block.

In steps S505 through S509, the determination value of the object block is decided such that the sum of differences between the difference-in-numbers in the object block and the difference in cumulative numbers at the other blocks approach 0. Accordingly, the cumulative number of "1"s and the cumulative number of "0"s in the block data generated in the past and the block data generated next becomes approximately equal.

In the example illustrated in FIG. 21, in a case where the difference in cumulative numbers of one or more other blocks regarding which block data has been generated in the past is 10 or more, the tentative determination value dL is decided to be the determination value for the block which is currently the object of processing. The difference-in-numbers L of the object block is 0 or a negative value. Accordingly, in a case where the difference-in-numbers L of the object block is a negative value, the difference in cumulative numbers between the object block and other blocks approaches 0. In a case where the difference-in-numbers L of the object block is 0, further increase in the difference in cumulative numbers between the object block and other blocks is suppressed.

For example, a case will be assumed where the difference in cumulative numbers in other blocks regarding which block data generated in the past is +12, and the difference-in-numbers L of the object block is −3. According to the flow in FIG. 21, in this case the flow proceeds from step S505 through step S506 and to step S507. As a result, the difference in cumulative numbers between the object block and other blocks is +12−3=+9.

In the example illustrated in FIG. 21, in a case where the difference in cumulative numbers of one or more other blocks regarding which block data has been generated in the past is −10 or less, the tentative determination value dM is decided as the determination value for the current object block. The difference-in-numbers M of the object block is 0 or a positive value. Accordingly, in a case where the difference-in-numbers M of the object block is a positive value, the difference in cumulative numbers between the object block and other blocks approaches 0. In a case where the difference-in-numbers M of the object block is 0, further decrease in the difference in cumulative numbers between the object block and other blocks is suppressed.

For example, a case will be assumed where the difference in cumulative numbers of other blocks regarding block data generated in the past is −15, and the difference-in-numbers M of the object block is +4. According to the flow in FIG. 21, in this case the flow proceeds from step S505 through step S506 and to step S508. As a result, the difference in cumulative numbers between the object block and other blocks is −15+4=−11.

In a case where the absolute value in the difference in cumulative numbers of other blocks is smaller than 10 in the example illustrated in FIG. 21, the tentative determination value which has the smaller absolute value of difference-in-numbers M and difference-in-numbers L is decided to be the determination value for the current object block. For example, in a case where the absolute value of the difference-in-numbers M is smaller than the absolute value of the difference-in-numbers L, the tentative determination value dM is decided to be the determination value of the object block. Alternatively, in a case where the absolute value of the difference-in-numbers L is smaller than the absolute value of the difference-in-numbers M, the tentative determination value dL is decided to be the determination value of the object block.

For example, a case where the difference-in-numbers M is +9, the difference-in-numbers L is −3, and the difference in cumulative numbers of other blocks is +8, will be assumed. According to the flow in FIG. 21, in this case the flow proceeds from step S505 to step S509. As a result, the difference in cumulative numbers between the object block and other blocks is +8−3=+5.

Note that a tentative determination value where the absolute value of difference-in-numbers of the "1"s and "0"s in the object block is the smallest is not always decided as the determination value in the flow illustrated in FIG. 21. However, in a case where the absolute value of difference in cumulative numbers of block data generated in the past is 10 or larger, a tentative determination value is selected which will reduce this absolute value of difference in cumulative numbers.

In step S510, the decided determination value is stored in the determination value register 32.

Thereafter, block data of the object block may be generated based on the decided determination value, following the flow from step S306 in FIG. 18 and subsequent steps, or step S407 in FIG. 20 and subsequent steps, for example. The generated block data may be output to the accumulator 34 as well. The accumulator 34 may add the numbers of "1"s and "0"s of this block data to the respective cumulative numbers of "1"s and "0"s accumulated so far.

In the example described above, the determination values for the blocks are sequentially decided so that there is no unevenness in the cumulated number of "0"s and the cumulated number of "1"s in the entirety containing multiple sets of block data generated so far. Accordingly, the randomness of data generated at the end can be improved.

Test Example 4 illustrated in FIG. 23 is an exemplary illustration of test results for randomness in 512 kb data generated by the method according to FIG. 18. FIG. 23 also shows Test Example 3, illustrating test results for randomness in 256 kb data generated by the same method, for comparison. The Test Example 3 illustrated in FIG. 23 and the Test Example 3 illustrated in FIG. 19 are identical. The larger data exhibited an increase in the difference in the number of "1"s and the number of "0"s, as Test Example 4 shows. On the other hand, Test Example 5 illustrated in FIG. 23 is an exemplary illustration of test results for randomness in 512 kb data generated by the method according to FIG. 21. Test Example 5 shows that according to the method in FIG. 21, increase in the difference in the number of "1"s and the number of "0"s was suppressed even through the data size was larger. As a result, Test Example 5 passed the monobit test which verifies randomness from the difference in the number of "1"s and the number of "0"s. That is to say, it has been found that randomness of data can be improved by the method according to FIG. 21.

[Correction of Determination Value]

The determination value set in FIG. 15 may be a value other than the median value, as long as in a range where the monobit test is passed. For example, the determination value may be set in FIG. 15 so that the difference-in-numbers approaches a predetermined value that is not 0.

For example, offset values α and β, where α and β are different integer, may be added to the number of "1"s and the number of "0"s, respectively. That is to say, the determination value may be set such that the difference between the number of "1"s to which the offset value α has been added and the number of "0"s to which the offset value β has been added approaches 0. Thus, the rate of passing the monobit test and the longest runs test, and so forth, can be improved, for example.

This correction of the determination value may be applied in the following situation, for example. The 512 kb data generated according to the method in FIGS. 15 and 21 failed to pass the runs test and the longest runs test by block, as shown in Test Example 5 in FIG. 23. To deal with this, the present inventors have found that the rate of passing the runs test and the longest runs test by block can be improved by correcting the determination value.

FIG. 22 illustrates the results of checking the length of the longest run for the "1"s in increment blocks, in the 512 kb data generated according to the method in FIGS. 15 and 21. For example, the longest run in block data "11100" is "111", and the longest run in block data "10110" is "11". FIG. 22 illustrates the results of a case of generating data without correcting the determination value, and the results of a case of generating data involving correcting the determination value, along with the rate of longest runs of "1"s in increment blocks, in theoretical values in data with a high level of randomness.

As illustrated in FIG. 22, the data generated without correcting the determination value exhibited high frequency of blocks with short longest runs, and low frequency of blocks with long longest runs, with regard to theoretical values. On the other hand, data generated with the determination value corrected so that the number of "1"s in the increment blocks was larger than the number of "0"s exhibited a distribution closer to the theoretical value as compared with the uncorrected data within the increment blocks. This is probably because the corrected determination value caused the number of memory cells corresponding to "1" to increase, so that runs of "1" occurred more readily.

Test Example 5 in FIG. 23 exemplarily illustrates test results of randomness in data generated without correcting the determination value. Test Example 6 exemplarily illustrates test results of randomness in data generated by correcting the determination value. An offset was set in Test Example 6 so that the number of "1"s in each block is eight more than the number of "0"s (i.e., α=8, β=0). While the difference in the number of "1"s and the number of "0"s increased in Test Example 6 over Text Example 5, Test Example 6 passed all test items, as can be seen in FIG. 23. That is to say, randomness can be improved by setting a predetermined offset in the determination value. Note that the specific value of the offset is not restricted to the above, rather, the offset value may be set to an optional value, within a range where the monobit test is not failed.

[Writing Data]

The data generated at the data generating device 10 may be written to the memory cell array 20. For example, the generated data may be written to the memory cell array 20 using the difference of whether or not the memory cells 21 are in the initial state. In this case, an arrangement may be made where the write circuit 14 applies forming stress only to memory cells 21 corresponding to "0", based on data stored in the mask data register 13, for example. Further, the write circuit 14 may apply voltage pulses which raise the resistance value of memory cells 21 corresponding to "1", within the initial resistance value range.

The generated data may also be written to the memory cell array 20 using the difference of whether the resistance values of the memory cells 21 are in the first resistance value range or the second resistance value range, for example. In this case, the write circuit 14 may apply one or the other of the second electric stress and the first electric stress to the memory cells 21.

[Method of Applying Data Generation Electric Stress Taking into Consideration Manufacturing Variance]

The various conditions for data generation electric stress in step S103 in FIG. 14, step S303 in FIG. 18, and step S403 in FIG. 20, may be set taking into conditions manufacturing variance. Examples of manufacturing variance include variance in thickness of the variable resistance layer, variance in defects within the wafer plane, and manufacturing variance from one lot to another. Even if the same electric stress is applied to an array of multiple memory cells, this variance can create large differences in resistance value distribution, and consequently impede generating random data.

For example, the memory cell array 20 may include a test region including multiple memory cells for testing, separate from the data generating region where resistance value information is read out to generate data. The memory cells for testing have approximately the same properties as the data generating memory cells. In a case where data generation electric stress is applied to the data generating memory cells, the various conditions of the electric stress may be decided based on multiple resistance value information pieces acquired from the test region. For example, these conditions may be decided based on the median value of multiple resistance value information pieces, acquired form the test region. The size of the test region is several hundred bits to several kilobits, for example. The memory cells for testing may have been subjected to application of tentative electric stress.

For example, the median value of multiple resistance value information pieces acquired from a memory cell array having an ideal resistance value distribution may be set as a reference median value beforehand. The various conditions for the data generation electric stress may be adjusted so that the median value of the multiple resistance value information pieces acquired from the object memory cell array 20 approaches the reference median value. Thus, even in a case where the properties of the memory cell array of each data generating device vary, data with high randomness can be generated.

The test region may not be within the object memory cell array. The test region may be formed in scribe regions between multiple memory cell arrays, when in the wafer state.

Some sort of information may be recorded in the test region after the data generation electric stress has been applied to the data generating memory cells. ID information may be recorded in the test region, for example.

The manufacturing device of the data generating device 10 may perform the operations to set the various conditions for the electric stress. Accordingly, various conditions for electric stress can be set without increasing the circuit scale of the data generating device 10.

[Supplement]

It will be clear to one skilled in the art from the above description that many improvements of the embodiment, and other embodiments, can be made. Accordingly, the above description should only be interpreted exemplarily. Details of the structure and/or functions may be substantially changed without departing from the spirit of the present disclosure.

Note that in the present disclosure, at least part of the functional blocks illustrated in the block diagrams may be carried out by semiconductor devices, integrated circuits (IC), large scale integration (LSI), or electronic circuits which are a combination thereof. LSIs and ICs may be integrated on a single chip, or may be a combination of multiple chips. For example, the functional blocks may be integrated on a single chip, for example. LSIs and ICs may be referred to as, for example, system LSI, very large scale integration (VLSI), or ultra large scale integration (ULSI), depending on the degree of integration thereof.

An aspect of the present disclosure is applicable to, for example, random number generators, IC cards, encryption system, communication systems, data servers, in-vehicle networks, and so forth.

While the present disclosure has been described with respect to exemplary embodiments thereof, it will be apparent to those skilled in the art that the disclosure may be modified in numerous ways and may assume many embodiments other than those specifically described above. Accordingly, it is intended by the appended claims to cover all modifications of the disclosure that fall within the true spirit and scope of the disclosure.

What is claimed is:

1. A data generating device comprising:
   a memory cell array including a plurality of memory cells;
   a read circuit operative to obtain a plurality of resistance value information pieces from the plurality of memory cells; and
   a data generator circuit operative to
      set a condition on the basis of the plurality of resistance value information pieces, and
      generate data, which are intrinsic to the data generating device and are not stored in the plurality of memory cells, by allocating, on the basis of the condition, the plurality of resistance value information pieces into a plurality of sets which respectively correspond to a plurality of values constituting the data,
   wherein each of the plurality of memory cells has a characteristic where, when in a variable state, a resistance value thereof reversibly changes between a plurality of variable resistance value ranges in accordance with an electric stress applied,
   wherein the plurality of values include a first value and a second value, and
   wherein the condition includes a condition that the data satisfies the following Expression (1) and Expression (2)

$$\text{erfc}(y) = \int_y^\infty \frac{2}{\sqrt{\pi}} e^{-x^2} dx \qquad (1)$$

$$\text{erfc}\left(\frac{|N1 - N2|}{\sqrt{2(N1 + N2)}}\right) \geq 0.01 \qquad (2)$$

where N1 represents a number of the first value and N2 represents a number of the second value.

2. The data generating device according to claim 1, wherein the data further satisfies that a difference between N1 and N2 is within a predetermined range except for 0.

3. The data generating device according to claim 1, wherein the data generator circuit is operative to
   set the condition including a median value of the plurality of resistance value information pieces, and
   generate the data by allocating the plurality of resistance value information pieces into the plurality of sets on the basis of comparison between the median value and each of the plurality of resistance value information pieces.

4. The data generating device according to claim 1, wherein the data generator circuit is further operative to test the data, and
   in a case where the data fails in the test, set a new condition on the basis of the plurality of resistance value information pieces, and generate new data to replace the data on the basis of the new condition.

5. The data generating device according to claim 1,
wherein each of the plurality of memory cells has a characteristic where, when in an initial state, a resistance value thereof is within an initial resistance value range which does not overlap any of the variable resistance value ranges, and
wherein the read circuit is operative to obtain the plurality of the resistance value information pieces from the plurality of memory cells after the forming stress has been applied to at least part of the plurality of memory cells in the initial state.

6. The data generating device according to claim 1,
wherein each of the plurality of memory cells has a characteristic where, when in an initial state, a resistance value thereof is within an initial resistance value range which does not overlap any of the variable resistance value ranges, and
wherein the data generator circuit is operative to
set one or more determination values, at least one of which corresponds to an initial resistance value within the initial resistance value range, and
generate the data by allocating the plurality of resistance value information pieces into the plurality of sets on the basis of comparison between the one or more determination values and each of the plurality of resistance value information pieces.

7. A data generating device comprising:
a memory cell array including a plurality of blocks, each of which includes a plurality of memory cells;
a read circuit operative to obtain a plurality of resistance value information pieces from the plurality of memory cells in each of the plurality of blocks; and
a data generator circuit operative to generate a plurality of block data by performing for each of the plurality of blocks:
setting a condition on the basis of the, plurality of resistance value information pieces in a block selected from the plurality of blocks; and
generating block data, which are intrinsic to the data generating device and are not stored in the plurality of memory cells, by allocating, on the basis of the condition, the plurality of resistance value information pieces in the selected block into a plurality of sets which respectively correspond to a plurality of values constituting the block data,
wherein each of the plurality of memory cells has a characteristic where, when in a variable state, a resistance value thereof reversibly changes between a plurality of variable resistance value ranges in accordance with an electric stress applied,
wherein the plurality of values include a first value and a second value, and
wherein the condition includes a condition that the block data satisfies the following Expression (3) and Expression (4)

$$\mathrm{erfc}(y) = \int_y^\infty \frac{2}{\sqrt{\pi}} e^{-x^2}\, dx \quad (3)$$

$$\mathrm{erfc}\left(\frac{|N1-N2|}{\sqrt{2(N1+N2)}}\right) \geq 0.01 \quad (4)$$

where N1 represents a number of the first value included in the block data, N2 represents a number of the second value included in the block data, and N1 is not equal to N2.

8. The data generating device according to claim 7,
wherein the data generator circuit is operative to perform:
setting the condition including a median value of the plurality of resistance value information pieces in the selected block; and
generating the block data by allocating the plurality of resistance value information pieces in the selected block into the plurality of sets on the basis of comparison between the median value and each of the plurality of resistance value information pieces.

9. The data generating device according to claim 7,
wherein the data generator circuit is operative to further perform:
testing the block data; and
in a case where the block data fails in the test, setting a new condition on the basis of the plurality of resistance value information pieces in the selected block, and generating new block data to replace the block data on the basis of the new condition.

10. The data generating device according to claim 7, further comprising:
a voltage application circuit,
wherein the data generator circuit is operative to further perform, before setting the condition:
testing the plurality of resistance value information pieces in the selected block on the basis of a test condition; and
in a case where the plurality of resistance value information pieces fail in the test, making the voltage application circuit apply a modification electric stress to at least part of the plurality of memory cells in the selected block, to update the plurality of resistance value information pieces.

11. The data generating device according to claim 10,
wherein the test condition includes a condition of even distribution of the plurality of resistance value information pieces, and
wherein the application of the modification electric stress causes unevenness in the plurality of resistance value information pieces in the selected block to be decreased.

12. The data generating device according to claim 7,
wherein the data generator circuit is operative to further perform:
setting the condition further on the basis of at least one selected from a cumulative number of the first value included in one or more block data that have been generated, a cumulative number of the second value included in the one or more block data, and a difference between the cumulative number of the first value and the cumulative number of the second value.

13. The data generating device according to claim 7,
wherein the data generator circuit is operative to further perform:
testing one or more block data that have been generated on the basis of at least one selected from a cumulative number of the first value included in the one or more block data, a cumulative number of the second value included in the one or more block data, and a difference between the cumulative number of the first value and the cumulative number of the second value; and in a case where the one or more block data fail in the test, setting a new condition on the basis of the plurality of resistance value information pieces in the selected block included in the one or more block data, and generating new block data to replace the block data at the selected block on the basis of the new condition.

14. The data generating device according to claim 7, wherein a data generator circuit is operative to further perform:
   testing one or more block data that have been generated on the basis of a test condition that the one or more block data satisfy the following Expression (5) and Expression (6)

$$\mathrm{erfc}(y) = \int_y^\infty \frac{2}{\sqrt{\pi}} e^{-x^2}\, dx \tag{5}$$

$$\mathrm{erfc}\left(\frac{|N1 - N2|}{\sqrt{2(N1 + N2)}}\right) \geq 0.01 \tag{6}$$

where N1 represents a cumulative number of the first value included in the one or more block data, and N2 represents a cumulative number of the second value included in the one or more block data.

15. A data generating method comprising:
   obtaining a plurality of resistance value information pieces from a plurality of memory cells included in a memory cell array;
   setting a condition on the basis of the plurality of resistance value information pieces; and
   generating data, which are intrinsic to the memory cell array and are not stored in the plurality of memory cells, by allocating, on the basis of the condition, the plurality of resistance value information pieces into a plurality of sets which respectively correspond to a plurality of values constituting the data,
   wherein each of the plurality of memory cells has a characteristic where, when in a variable state, a resistance value thereof reversibly changes between a plurality of variable resistance value ranges in accordance with an electric stress applied,
   wherein the plurality of values include a first-value and a second value, and
   wherein the condition includes a condition that the data satisfies the following Expression (1) and Expression (2)

$$\mathrm{erfc}(y) = \int_y^\infty \frac{2}{\sqrt{\pi}} e^{-x^2}\, dx \tag{1}$$

$$\mathrm{erfc}\left(\frac{|N1 - N2|}{\sqrt{2(N1 + N2)}}\right) \geq 0.01 \tag{2}$$

where N1 represents a number of the first value and N2 represents a number of the second value.

* * * * *